US012628495B2

(12) United States Patent (10) Patent No.: US 12,628,495 B2
Cho et al. (45) Date of Patent: May 12, 2026

(54) LIGHT EMITTING DEVICE AND DISPLAY DEVICE INCLUDING THE SAME

(71) Applicant: Samsung Electronics Co., Ltd., Suwon-si (KR)

(72) Inventors: Oul Cho, Suwon-si (KR); Kwanghee Kim, Suwon-si (KR); Yuho Won, Suwon-si (KR); Jae Yong Lee, Suwon-si (KR); Taehyung Kim, Suwon-si (KR)

(73) Assignees: SAMSUNG ELECTRONICS CO., LTD., Gyeonggi-Do (KR); SAMSUNG DISPLAY CO., LTD., Gyeonggi-Do (KR)

( * ) Notice: Subject to any disclaimer, the term of this patent is extended or adjusted under 35 U.S.C. 154(b) by 446 days.

(21) Appl. No.: 18/240,451

(22) Filed: Aug. 31, 2023

(65) Prior Publication Data

US 2024/0074222 A1 Feb. 29, 2024

(30) Foreign Application Priority Data

Aug. 31, 2022 (KR) ........................ 10-2022-0109987

(51) Int. Cl.
 H10K 50/115 (2023.01)
 C09K 11/56 (2006.01)
 (Continued)

(52) U.S. Cl.
 CPC .......... H10K 50/115 (2023.02); C09K 11/565 (2013.01); C09K 11/883 (2013.01);
 (Continued)

(58) Field of Classification Search
 CPC ................................................... H10K 50/115
 (Continued)

(56) References Cited

U.S. PATENT DOCUMENTS

2017/0250322 A1* 8/2017 Wang .................. H10H 20/854
2021/0102119 A1 4/2021 Kim et al.
 (Continued)

FOREIGN PATENT DOCUMENTS

EP 3540806 A1 9/2019
JP 6225912 B2 11/2017
 (Continued)

OTHER PUBLICATIONS

Eunjoo Jang et al., "White-Light-Emitting Diodes with Quantum Dot Color Converters for Display Backlights," Adv. Mater., 2010, pp. 3076-3080, vol. 22.
 (Continued)

*Primary Examiner* — Christopher M Raabe
(74) *Attorney, Agent, or Firm* — CANTOR COLBURN LLP

(57) ABSTRACT

An electroluminescent device includes a quantum dot layer disposed between a first electrode and a second electrode, and an electron transport layer disposed between the quantum dot layer and the second electrode; wherein the quantum dot layer is configured to emit a first light, the quantum dot layer including first quantum dots, wherein the first quantum dots include a first semiconductor nanocrystal, wherein the electron transport layer includes zinc oxide nanoparticles, wherein the electroluminescent device further comprises a first layer between the quantum dot layer and the electron transport layer, the first layer including inorganic nanoparticles, wherein the inorganic nanoparticles has a different composition from the zinc oxide nanoparticles and the first quantum dots, and wherein the inorganic nanoparticles comprises a metal chalcogenide having a bandgap energy of greater than or equal to about 2.9 electron volts (eV) and less than or equal to about 10 eV.

21 Claims, 17 Drawing Sheets

(51) Int. Cl.

| | |
|---|---|
| *C09K 11/88* | (2006.01) |
| *H10K 50/16* | (2023.01) |
| *B82Y 20/00* | (2011.01) |
| *B82Y 40/00* | (2011.01) |
| *H10K 102/00* | (2023.01) |

(52) U.S. Cl.
  CPC .............. *H10K 50/16* (2023.02); *B82Y 20/00* (2013.01); *B82Y 40/00* (2013.01); *H10K 2102/331* (2023.02)

(58) Field of Classification Search
  USPC ................................................. 313/498–512
  See application file for complete search history.

(56) References Cited

U.S. PATENT DOCUMENTS

| | | | | |
|---|---|---|---|---|
| 2022/0267672 | A1* | 8/2022 | Yeh ...................... | C09K 11/883 |
| 2023/0235220 | A1* | 7/2023 | Min ..................... | H10K 50/115 257/40 |
| 2023/0337447 | A1 | 10/2023 | Mei et al. | |
| 2024/0052241 | A1* | 2/2024 | Yeh .................... | C09K 11/0883 |
| 2025/0351649 | A1* | 11/2025 | Yoon .................. | H10H 29/8512 |

FOREIGN PATENT DOCUMENTS

| | | | |
|---|---|---|---|
| JP | 6969351 | B2 | 11/2021 |
| KR | 20210080923 | A | 7/2021 |
| WO | 2022062718 | A1 | 3/2022 |
| WO | 2022064695 | A1 | 3/2022 |

OTHER PUBLICATIONS

Seth Coe et al. "Electroluminescence from single monolayers of nanocrystals in molecular organic devices," Nature, Dec. 2002, pp. 800-803, vol. 420.

Tae-Ho Kim et al., "Full-colour quantum dot displays fabricated by transfer printing," Nature Photonics, Feb. 20, 2011, pp. 176-182, vol. 5.

Extended European Search Report dated Feb. 6, 2024, of the corresponding European Patent Application No. 23194447.1.

\* cited by examiner

FIG. 4C

LIGHT EMITTING DEVICE AND DISPLAY DEVICE INCLUDING THE SAME

CROSS-REFERENCE TO RELATED APPLICATION

This application claims priority to Korean Patent Application No. 10-2022-0109987 filed in the Korean Intellectual Property Office on Aug. 31, 2022, and all the benefits accruing therefrom under 35 U.S.C. § 119, the content of which in its entirety is herein incorporated by reference.

BACKGROUND

1. Field

The present disclosure relates to a light emitting (e.g., electroluminescent) device and a display device including the electroluminescent device.

2. Description of the Related Art

A semiconductor nanoparticle (e.g., a semiconductor nanocrystal particle) having a nanometer size may exhibit luminescence properties. For example, a quantum dot including a semiconductor nanocrystal may exhibit a quantum confinement effect. The light emission from the semiconductor nanoparticle may occur when an electron in an excited state resulting from light excitation or an applied voltage transitions from a conduction band to a valence band. The semiconductor nanoparticle may be configured to emit light of a desired wavelength region by adjusting a size of the semiconductor nanoparticle, a composition of the semiconductor nanoparticle, or a combination thereof.

A semiconductor nanoparticle may be used, for example, in a light emitting device (e.g., an electroluminescent device) or a display device including the electroluminescent device.

SUMMARY

An embodiment provides a luminescent device that is configured to emit light, for example, by applying a voltage to a nanostructure (e.g., a semiconductor nanoparticle such as a quantum dot), for example with or without a separate irradiation light source.

An embodiment provides a display device (e.g., a quantum dot-light emitting diode ("QD-LED") display device) that includes a semiconductor nanoparticle such as a quantum dot as a component of a light emitting layer in a pixel configuration (e.g., in a configuration of a blue pixel, a red pixel, a green pixel, or a combination thereof).

An embodiment provides a method of producing the electroluminescent device.

In an embodiment, an electroluminescent device includes:
a first electrode and a second electrode spaced apart from each other (e.g., each electrode having a surface opposite the other), a quantum dot layer disposed between the first electrode and the second electrode, and an electron transport layer disposed between the quantum dot layer and the second electrode;
wherein the quantum dot layer is configured to emit a first light, the quantum dot layer including a plurality of first quantum dots,
wherein the first quantum dot includes a first semiconductor nanocrystal, wherein the electron transport layer includes zinc oxide nanoparticles,
wherein the electroluminescent device further includes a first layer between the quantum dot layer and the electron transport layer, the first layer including a plurality of inorganic nanoparticles,
wherein the inorganic nanoparticle has a different composition from the zinc oxide nanoparticle and the first quantum dot (for example, the first semiconductor nanocrystal), and
wherein the inorganic nanoparticle includes a metal chalcogenide, and wherein the metal chalcogenide has a bandgap energy that is greater than an optical energy of the first light.

The bandgap energy of the metal chalcogenide may be greater than or equal to about 2.9 eV, greater than or equal to about 3.2 eV, greater than or equal to about 3.4 eV, and less than or equal to about 10 eV.

The first light may have a red light spectrum, a green light spectrum, or a blue light spectrum.

A full width at half maximum of the first light may be less than or equal to about 55 nanometers (nm), less than or equal to about 46 nm, or less than or equal to about 45 nm.

The first light (or a luminescent peak thereof) may have a full width at half maximum of greater than or equal to about 1 nm, or greater than or equal to about 10 nm.

As an applied voltage on the electroluminescent device is changed from about 2 volts to about 6 volts, a luminescent peak of the first light may exhibit a blue shift of greater than or equal to about 8 nm and less than or equal to about 15 nm.

As an applied voltage on the electroluminescent device is changed from about 2 volts to about 6 volts, a full width at half maximum of the first light may decrease by greater than or equal to about 8 nm and less than or equal to about 20 nm.

The first quantum dots may have a core-shell structure. The core shell structure may include a core including the first semiconductor nanocrystal and a shell disposed on the core. The shell may include a crystalline or amorphous inorganic material.

The first semiconductor nanocrystal may include a zinc chalcogenide (e.g., a zinc selenide, a zinc selenide telluride), indium phosphide, or a combination thereof.

The quantum dot layer may not include the plurality of inorganic nanoparticles.

The zinc oxide nanoparticles may further include an alkali metal, an alkaline earth metal, Zr, W, Li, Ti, Y, Al, gallium, indium, tin (Sn), cobalt (Co), vanadium (V), or a combination thereof.

The metal chalcogenide may include zinc, magnesium, calcium, barium, or a combination thereof.

The metal chalcogenide may include a magnesium sulfide, a magnesium selenide, a magnesium sulfide selenide, a zinc magnesium selenide, a zinc magnesium sulfide, a zinc sulfide, a zinc selenide sulfide, or a combination thereof.

The inorganic nanoparticle may have a size (or an average size, hereinafter, size) of greater than or equal to about 2 nm, or greater than or equal to about 2.5 nm.

The inorganic nanoparticle may have a size of less than or equal to about 30 nm or less than or equal to about 20 nm.

The bandgap energy of the metal chalcogenide may be greater than or equal to about 3.0 eV, or greater than or equal to about 3.4 eV.

The inorganic nanoparticle may exhibit a bandgap energy of greater than or equal to about 3.0 eV, or greater than or equal to about 3.4 eV.

The inorganic nanoparticle or the metal chalcogenide may exhibit a bandgap energy of less than or equal to about 7 eV, less than or equal to about 6.8 eV, or less than or equal to about 5.5 eV.

The first layer may further include a plurality of semiconductor nanocrystal particles (e.g., a second quantum dot). The semiconductor nanocrystal particle or the second quantum dot may include the first semiconductor nanocrystal. In the first layer, the second quantum dot may have a core shell structure including the core including the first semiconductor nanocrystal and a shell disposed on the core. The shell may include a crystalline or amorphous inorganic material.

The first or second quantum dot or the first semiconductor nanocrystal may include a Group II-VI compound, a Group III-V compound, a Group IV-VI compound, a Group IV element or a compound thereof, a Group compound, a Group I-II-IV-VI compound, or a combination thereof.

In an embodiment, the first semiconductor nanocrystal may include a zinc chalcogenide, an indium phosphide, or a combination thereof.

The first layer may have a thickness of greater than or equal to about 4 nm.

The first layer may have a thickness of less than or equal to about 50 nm.

The quantum dot layer may have a thickness of greater than or equal to about 5 nm, or greater than or equal to about 7 nm.

The quantum dot layer may have a thickness of less than or equal to about 80 nm, or less than or equal to about 50 nm.

In an embodiment, the electroluminescent device includes a first electrode and a second electrode; a light emitting layer disposed between the first electrode and the second electrode, the light emitting layer including a semiconductor nanoparticle population; and optionally, an electron auxiliary layer between the light emitting layer and the second electrode, wherein the light emitting layer is configured to emit the first light, wherein the semiconductor nanoparticle population includes a plurality of quantum dots and a plurality of inorganic nanoparticles, wherein the first light has (a maximum emission peak that has) a full width at half maximum of greater than or equal to about 1 nm and less than or equal to about 55 nm, wherein the semiconductor nanoparticle population exhibits a multi-modal distribution (e.g., a bimodal distribution) including a first peak particle size and a second peak particle size in a size analysis, wherein the second peak particle size is greater than the first peak particle size, and wherein the first peak particle size is greater than or equal to about 2 nm and less than or equal to about 15 nm.

The first light may have a red light spectrum, a green light spectrum, or a blue light spectrum.

The quantum dot may include a first semiconductor nanocrystal.

The inorganic nanoparticle may include a metal chalcogenide, and a bandgap energy of the inorganic nanoparticle or the metal chalcogenide may be greater than a bandgap energy of the first semiconductor nanocrystal or an optical energy of the first light by greater than or equal to about 0.1 eV (e.g., greater than or equal to about 0.2 eV, or greater than or equal to about 0.5 eV).

The quantum dot may include a zinc chalcogenide including zinc and selenium, and optionally tellurium, and the inorganic nanoparticle may include a metal sulfide, and the metal sulfide may include zinc, magnesium, or a combination thereof. The zinc chalcogenide may include ZnSe, ZnSeTe, ZnSeS, or a combination thereof. The quantum dot may further include a zinc sulfide.

The bandgap energy of the metal chalcogenide or the inorganic nanoparticle may be greater than or equal to 2.9 electron volts and less than or equal to 10 electron volts; or greater than or equal to 3.4 electron volts and less than or equal to 6.8 electron volts.

In an embodiment, the light emitting layer may have a mole ratio of sulfur to selenium that is greater than or equal to about 0.1:1, greater than or equal to about 0.5:1, and less than or equal to about 2.0:1, less than or equal to about 1.5:1, less than or equal to about 1.1:1, less than or equal to about 0.8:1.

In an embodiment, the light emitting layer may have a mole ratio of sulfur to selenium in a range of from about 2:1 to about 5:1, from about 2.5:1 to about 4.5:1, from about 3:1 to about 4:1, or a combination thereof.

The first peak particle size may be greater than or equal to about 3 nm, or greater than or equal to about 3.5 nm.

The first peak particle size may be less than or equal to about 6 nm, less than or equal to about 5 nm.

The second peak particle size may be greater than or equal to about 7 nm, or greater than or equal to about 8 nm.

The second peak particle size may be less than or equal to about 50 nm, or less than or equal to about 40 nm.

In an embodiment, a difference between the first peak particle size and the second peak particle size may be greater than or equal to about 3 nm, greater than or equal to about 5 nm and less than or equal to about 20 nm or less than or equal to about 8 nm.

A ratio (e.g., bimodal ratio) of a frequency value (e.g., second mode) or number of the second peak particle size to a frequency value (e.g., first mode) or number of the first peak particle size may be greater than or equal to about 0.1:1.

A ratio of a frequency value or a number (mode) of the second peak particle size to a frequency value or a number (mode) of the first peak particle size may be less than or equal to about 1:1.

The electron auxiliary layer may include an electron transport layer, and the electron transport layer may include a zinc oxide nanoparticle and the inorganic nanoparticle may have a different composition from the zinc oxide nanoparticle and the quantum dot.

The quantum dot or the first semiconductor nanocrystal may include a Group II-VI compound, a Group III-V compound, a Group IV-VI compound, a Group IV element or a compound thereof, a Group compound, a Group I-II-IV-VI compound, or a combination thereof.

The quantum dot may include a core comprising the first semiconductor nanocrystal and a shell disposed on the core, and the core or the first semiconductor nanocrystal comprises a zinc chalcogenide, an indium phosphide, or a combination thereof. The zinc chalcogenide may include zinc, selenium, and optionally tellurium. The shell may include a crystalline or amorphous inorganic material. The shell may include a zinc selenide, a zinc sulfide, a zinc selenide sulfide, or a combination thereof.

The quantum dot may include a zinc chalcogenide comprising zinc and selenium, and the inorganic nanoparticle may include a metal sulfide, and the metal sulfide comprises zinc, magnesium, or a combination thereof. The inorganic nanoparticle may not include ZnSe. The metal sulfide may include a magnesium sulfide, a magnesium selenide sulfide, a zinc magnesium sulfide, a zinc sulfide, or a combination thereof.

The light emitting layer may include a first layer comprising the inorganic nanoparticles and optionally the quantum dots; and a quantum dot layer comprising the quantum dots and optionally the inorganic nanoparticles.

In an embodiment, the first layer may be disposed between the quantum dot layer and the electron auxiliary layer. In an embodiment, the quantum dot layer may be disposed between the first layer and the electron auxiliary layer.

In an embodiment, an electroluminescent device includes a first electrode and a second electrode spaced apart; a light emitting layer disposed between the first electrode and the second electrode; and optionally, an electron auxiliary layer between the light emitting layer and the second electrode, wherein the light emitting layer is configured to emit the first light, and the emission layer includes a plurality of quantum dots and a plurality of inorganic nanoparticles, and the first light has (a maximum emission peak that has) a full width at half maximum of greater than or equal to 1 nm and less than or equal to 55 nm.

The plurality of inorganic nanoparticles has a size of greater than or equal to about 2 nm and less than or equal to about 15 nm. In an embodiment, as the first layer or the light emitting layer is exposed to a high-power laser emitting light of a predetermined wavelength for 60 seconds, the first layer or the light emitting layer may exhibit a luminance intensity maintenance percentage of greater than or equal to about 100% and less than or equal to about 120% for an initial luminance intensity of 100%.

The first layer or the light emitting layer may exhibit a current density of greater than or equal to about 25 milliamperes per square centimeter (mA/cm 2) and less than or equal to about 158 mA/cm 2 at 3 volts during a first (initial) sweep as a current-voltage ("JV") graph is obtained by applying a voltage of 0 volts to 8 volts to a stacked structure of an anode/the electron transport layer/the first layer or the light emitting layer/the electron transport layer/a cathode.

The first layer or the light emitting layer may have a maximum current density of greater than or equal to about 106 mA/cm$^2$ (and less than or equal to about 300 mA/cm$^2$) appearing during a third sweep as a JV graph is obtained by applying a voltage of 0 volts to 8 volts to a stacked structure of an anode/the electron transport layer/the first layer or the light emitting layer/the electron transport layer/a cathode.

The first layer or the light emitting layer may exhibit a current density of greater than or equal to about 0.1 mA/cm$^2$, or greater than or equal to about 15 mA/cm 2 when a voltage (for example, of 8 volts) is applied to a stacked structure of an anode/a hole auxiliary layer including poly(3,4-ethylenedioxythiophene) ("PEDOT")/the first layer or the light emitting layer/a hole auxiliary layer including 4,4',4"-tris(N-carbazolyl)-triphenylamine ("TCTA")/a cathode.

The first layer or the light emitting layer may exhibit a current density of less than or equal to about 125 mA/cm$^2$, or less than or equal to about 50 mA/cm$^2$ when a voltage (for example, of 8 volts) is applied to a stacked structure of an anode/a hole auxiliary layer including poly(3,4-ethylenedioxythiophene) ("PEDOT")/the first layer/a hole auxiliary layer including 4,4',4"-tris(N-carbazolyl)-triphenylamine ("TCTA")/a cathode.

The electroluminescent device may be configured to emit blue light.

The electroluminescent device may exhibit a maximum luminance of greater than or equal to about 100,000 nits (candelas per square meter, cd/m 2). The electroluminescent device may exhibit a maximum luminance of greater than or equal to about 10,000,000 nits.

The electroluminescent device may exhibit a maximum external quantum efficiency of greater than or equal to about 11%. The maximum external quantum efficiency may be less than or equal to 100%, or less than or equal to about 60%

The electroluminescent device may have a T90 of greater than or equal to about 26 hours, greater than or equal to about 36 hours, greater than or equal to about 48 hours, greater than or equal to about 60 hours, as operated at an initial luminance of about 650 nits. The electroluminescent device may have a T90 of less than or equal to about 10,000 hours, or less than or equal to about 5,000 hours as operated at an initial luminance of about 650 nits.

In an embodiment, a method of manufacturing an electroluminescent device may include forming a quantum dot layer and a first layer on a first electrode, forming an electron transport layer including zinc oxide nanoparticles on the first layer, and forming a second electrode on the electron transport layer, wherein the quantum dot layer includes a first semiconductor nanocrystal or a quantum dot including the first semiconductor nanocrystal, wherein the first layer includes inorganic nanoparticles including a metal chalcogenide having a bandgap energy of greater than or equal to about 2.9 electron volts (eV) and less than or equal to about 10 eV and having a different composition from the zinc oxide nanoparticles and the first semiconductor nanocrystal.

Details of the electroluminescent device are the same as described herein.

In an embodiment, a display device or an electronic device may include the electroluminescent device.

The display device or an electronic device may include (or may be) augmented reality ("AR")/virtual reality ("VR") device, a handheld terminal, a monitor, a notebook computer, a television, an electronic display board, a camera, an electronic display component for an autonomous vehicle or an electric car.

In an embodiment, an electroluminescent device capable of simultaneously exhibiting improved life and electroluminescence characteristics (e.g., device efficiency and luminance) may be provided. According to an embodiment, an electron transport channel linked to a trap level of a quantum dot or a light-emitting semiconductor nanoparticle can be relatively suppressed, and an amount of holes transported to a valence band of the light-emitting semiconductor nanoparticle can be controlled, reducing leakage of an excess of holes. In the electroluminescent device of an embodiment, a quenching phenomenon or a shift of a luminescent wavelength to a longer wavelength range that may be caused by an energy transition of a quantum dot or a light-emitting semiconductor nanoparticle in the light emitting layer or quantum dot layer may be reduced.

BRIEF DESCRIPTION OF THE DRAWINGS

The above and other advantages and features of this disclosure will become more apparent by describing in further detail exemplary embodiments thereof with reference to the accompanying drawings, in which:

FIG. 4C illustrates a schematic cross-sectional view of an embodiment of a light emitting layer (a quantum dot layer and a first layer) in an electroluminescent device;

DETAILED DESCRIPTION

Figure 1A:
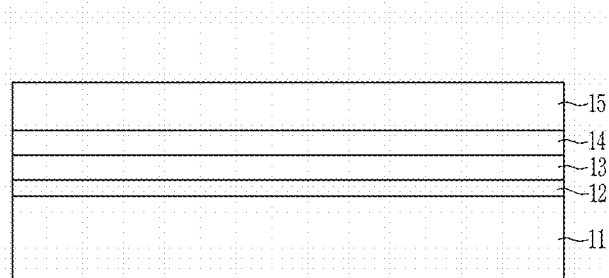
FIG. 1A is a schematic cross-sectional view of an embodiment of an electroluminescent device.

Advantages and characteristics of this disclosure, and a method for achieving the same, will become evident referring to the following example embodiments together with the drawings attached hereto. However, the embodiments should not be construed as being limited to the embodiments set forth herein. Rather, these embodiments are provided so that this disclosure will be thorough and complete, and will fully convey the scope of the invention to those skilled in the art.

In order to clearly explain the present disclosure, parts irrelevant to the description are omitted, and the same reference numerals are assigned to the same or similar elements throughout the specification. In the drawings, the thickness of layers, films, panels, regions, etc., are exaggerated for clarity. And in the drawings, for convenience of description, the thickness of some layers and regions are exaggerated. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In addition, it will be understood that when an element such as a layer, film, region, or substrate is referred to as being "on" another element, it can be directly on the other element or intervening elements may also be present. In contrast, when an element is referred to as being "directly on" another element, there are no intervening elements present. Also, to be disposed "on" the reference portion means to be disposed above or below the reference portion and does not necessarily mean "above".

It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. For example, "a nanoparticle" and "the nanoparticle" may refer to a single particle or a plurality of particles. "At least one" is not to be construed as being limited to "a" or "an." "Or" means "and/or."

As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, the term "cross-sectional view" means a case in which a cross-section of a given object is cut, for example, in a substantially vertical direction and is viewed laterally.

Unless otherwise defined, all terms (including technical and scientific terms) used herein have the same meaning as commonly understood by one of ordinary skill in the art to which this disclosure belongs. It will be further understood that terms, such as those defined in commonly used, e.g., non-technical, dictionaries, should be interpreted as having a meaning that is consistent with their meaning in the context of the relevant art and the present disclosure, and will not be interpreted in an idealized or overly formal sense unless expressly so defined herein.

Hereinafter, values of a work function, a conduction band, or a lowest unoccupied molecular orbital ("LUMO") (or valence band or highest occupied molecular orbital ("HOMO")) energy level is expressed as an absolute value from a vacuum level. In addition, when the work function or the energy level is referred to be "deep," "high" or "large," the work function or the energy level has a large absolute value based on "0 electron volts (eV)" of the vacuum level, while when the work function or the energy level is referred to be "shallow," "low," or "small," the work function or energy level has a small absolute value based on "0 eV" of the vacuum level.

As used herein, the average (value) may be mean or median. In an embodiment, the average (value) may be a mean average.

As used herein, the term "peak emission wavelength" is the wavelength at which a given emission spectrum of the light reaches its maximum.

As used herein, an optical energy of a first light is a photon energy corresponding to a peak emission wavelength of a first light. The energy of light (or photon energy), E, is known to be inversely proportional to the wavelength by the equation:

$$E = hc/\lambda \qquad \text{(equation 1)}$$

where h is Planck's constant ($6.6261 \times 10^{-34}$ J*s) and c is the speed of light ($2.9979 \times 10^8$ m/s).

Photon energy can be expressed using any unit of energy such as the electronvolt (eV) or the Joule (J).

According to the definition about 1 eV of the International System of Quantities (SI), equation 1 above can be rewritten for photon energy in eV and wavelength in nm as:

$$E \text{ (eV)} = 1240/\lambda \text{(nm)} \qquad \text{(equation 2)}$$

As used herein, the term "Group" may refer to a group of Periodic Table.

As used herein, "Group I" refers to Group IA and Group IB, and examples may include Li, Na, K, Rb, and Cs, but are not limited thereto.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group IIIA metal may be Al, In, Ga, and TI, and examples of Group IIIB may be scandium, yttrium, or the like, but are not limited thereto.

As used herein, "Group IV" refers to Group IVA and Group IVB, and examples of a Group IVA metal may be Si, Ge, and Sn, and examples of Group IVB metal may be titanium, zirconium, hafnium, or the like, but are not limited thereto.

As used herein, "Group V" includes Group VA and includes nitrogen, phosphorus, arsenic, antimony, and bismuth, but is not limited thereto.

As used herein, "Group VI" includes Group VIA and includes sulfur, selenium, and tellurium, but is not limited thereto.

As used herein, "metal" includes a semi-metal such as Si.

As used herein, a number of carbon atoms in a group or a molecule may be referred to as a subscript (e.g., $C_{6-50}$) or as C6 to C50.

As used herein, when a definition is not otherwise provided, "substituted" refers to replacement of a, e.g., at least one, hydrogen of a compound or a group for a corresponding group moiety including a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO₂), a cyano group (—CN), an amino group (—NRR' wherein R and R' are each independently hydrogen or a C1 to C6 alkyl group), an azido group (—N₃), an amidino group (—C(=NH)NH₂), a hydrazino group (—NHNH₂), a hydrazono group ($=N(NH_2)$), an aldehyde group ($-C(=O)H$), a carbamoyl group ($-C(O)NH_2$), a thiol group ($-SH$), an ester group ($-C(=O)OR$, wherein R is a C1 to C6 alkyl group or a C6 to C12 aryl group), a carboxyl group ($-COOH$) or a salt thereof ($-C(=O)OM$, wherein M is an organic or inorganic cation), a sulfonic acid group ($-SO_3H$) or a salt thereof ($-SO_3M$, wherein M is an organic or inorganic cation), a phosphoric acid group ($-PO_3H_2$) or a salt thereof ($-PO_3MH$ or $-PO_3M_2$, wherein M is an organic or inorganic cation), or a combination thereof.

As used herein, when a definition is not otherwise provided, "hydrocarbon" or "hydrocarbon group" refers to a compound or a group including carbon and hydrogen (e.g., alkyl, alkenyl, alkynyl, or aryl group). The hydrocarbon group may be a monovalent group or a group having a valence of greater than one formed by removal of a, e.g., one or more, hydrogen atoms from alkane, alkene, alkyne, or arene. In the hydrocarbon or hydrocarbon group, a, e.g., at least one, methylene may be replaced by an oxide moiety, a carbonyl moiety, an ester moiety, $-NH-$, or a combination thereof. Unless otherwise stated to the contrary, the hydrocarbon compound or hydrocarbon group (alkyl, alkenyl, alkynyl, or aryl) may have 1 to 60, 2 to 32, 3 to 24, or 4 to 12 carbon atoms.

As used herein, when a definition is not otherwise provided, "alkyl" refers to a linear or branched saturated monovalent hydrocarbon group (methyl, ethyl hexyl, etc.). In an embodiment, an alkyl group may have from 1 to 50 carbon atoms, or 1 to 18 carbon atoms, or 1 to 12 carbon atoms.

As used herein, when a definition is not otherwise provided, "alkenyl" refers to a linear or branched monovalent hydrocarbon group having a carbon-carbon double bond. In an embodiment, an alkenyl group may have from 2 to 50 carbon atoms, or 2 to 18 carbon atoms, or 2 to 12 carbon atoms.

As used herein, when a definition is not otherwise provided, "alkynyl" refers to a linear or branched monovalent hydrocarbon group having a carbon-carbon triple bond. In an embodiment, an alkenyl group may have from 2 to 50 carbon atoms, or 2 to 18 carbon atoms, or 2 to 12 carbon atoms.

As used herein, when a definition is not otherwise provided, "aryl" refers to a group formed by removal of a, e.g., at least one, hydrogen from an arene (e.g., a phenyl or naphthyl group). In an embodiment, an aryl group may have 6 to 50 carbon atoms, or 6 to 18 carbon atoms, or 6 to 12 carbon atoms.

As used herein, when a definition is not otherwise provided, "hetero" refers to inclusion of 1 to 3 heteroatoms, e.g., N, O, S, Si, P, or a combination thereof.

As used herein, when a definition is not otherwise provided, "alkoxy" refers to an alkyl group linked to oxygen (e.g., alkyl-O—) for example, a methoxy group, an ethoxy group, or a sec-butyloxy group.

As used herein, when a definition is not otherwise provided, "amine" is a compound represented by $NR_3$, wherein each R is independently hydrogen, a C1-C12 alkyl group, a C7-C20 alkylaryl group, a C7-C20 arylalkyl group, or a C6-C18 aryl group.

As used herein, the expression "not including cadmium (or other harmful heavy metal)" may refer to the case in which a concentration of cadmium (or another heavy metal deemed harmful) may be less than or equal to about 100 parts per million by weight ("ppmw"), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other toxic heavy metal) may be present or, if present, an amount of cadmium (or other heavy metal) may be less than or equal to a detection limit or as an impurity level of a given analysis tool (e.g., an inductively coupled plasma atomic emission spectroscopy instrument).

Unless mentioned to the contrary, a numerical range recited herein is inclusive. Unless mentioned to the contrary, a numerical range recited herein includes any real number within the endpoints of the stated range and includes the endpoints thereof. As used herein, the upper and lower endpoints set forth for various numerical values may be independently combined to provide a range.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±5% of the stated value.

As used herein, a nanoparticle is a structure having a, e.g., at least one, region or characteristic dimension with a nanoscale dimension. In an embodiment, a dimension (or an average dimension) of the nanostructure is less than or equal to about 500 nm, less than or equal to about 300 nm, less than or equal to about 250 nm, less than or equal to about 150 nm, less than or equal to about 100 nm, less than or equal to about 50 nm, or less than or equal to about 30 nm. In an embodiment, the nanoparticle may have any suitable shape. The nanoparticle (e.g., a semiconductor nanoparticle or a metal oxide nanoparticle) may include a nanowire, a nanorod, a nanotube, a branched nanostructure, a nanotetrapod, a nanotripod, a nanobipod, a nanocrystal, a nanodot, a multi-pod type shape such as at least two pods, or the like and is not limited thereto. The nanoparticle can be, e.g., substantially crystalline, substantially monocrystalline, polycrystalline, (for example, at least partially) amorphous, or a combination thereof.

In an embodiment, a quantum dot is a type of a semiconductor nanocrystal particle and is a nanostructure that can exhibit a quantum confinement effect or an exciton confinement effect. As used herein, the term "quantum dot" or "semiconductor nanoparticle" is not limited in a shape thereof unless otherwise defined. A semiconductor nanoparticle or a quantum dot may have a size smaller than a Bohr excitation diameter for a bulk crystal material having an identical composition and may exhibit a quantum confinement effect. The semiconductor nanoparticle or the quantum dot may include a semiconductor nanocrystal acting as an emission center and, by controlling a size of a nanocrystal, it may be configured to emit light of a desired peak emission wavelength that corresponds to a bandgap energy thereof. The emission center may include or may not include a dopant. The presence of the dopant may not substantially affect the peak emission wavelength of the semiconductor nanocrystal, and the change in the peak emission wavelength according to the presence of the dopant may be less than 10 nm, less than or equal to about 7 nm, less than or equal to about 5 nm, or less than or equal to about 3 nm.

As used herein, the term "T50" is a time (hours, hr) the brightness (e.g., luminance) of a given device decreases to 50% of the initial brightness (100%) as, e.g., when, the given device is started to be driven, e.g., operated, at a predetermined initial brightness (e.g., 650 nit).

As used herein, the term "T90" is a time (hr) the brightness (e.g., luminance) of a given device decreases to 90% of the initial brightness (100%) as the given device is started to be driven at a predetermined initial brightness (e.g., 650 nit).

As used herein, the phrase "external quantum efficiency" or EQE is a ratio of the number of photons emitted from a light emitting diode ("LED") to the number of electrons passing through the device and can be a measurement as to how efficiently a given device converts electrons to photons and allows the photons to escape. In an embodiment, the EQE may be determined by the following equation:

EQE=an efficiency of injection×a (solid-state) quantum yield×an efficiency of extraction.

wherein the efficiency of injection is a proportion of electrons passing through the device that are injected into the active region, the quantum yield is a proportion of all electron-hole recombination in the active region that are radiative and produce photons, the efficiency of extraction is a proportion of photons generated in the active region that escape from the given device.

As used herein, a maximum EQE is a greatest value of the EQE.

As used herein, a maximum luminance is the highest value of luminance for a given device.

As used herein, the phrase, quantum efficiency, may be used interchangeably with the phrase, quantum yield. In an embodiment, the quantum efficiency may be a relative quantum yield or an absolute quantum yield, for example, which can be readily measured by any suitable, e.g., commercially available, equipment. The quantum efficiency (or quantum yield) may be measured in a solution state or a solid state (in a composite). In an embodiment, "quantum yield (or quantum efficiency)" may be a ratio of photons emitted to photons absorbed, e.g., by a nanostructure or population of nanostructures. In an embodiment, the quantum efficiency may be determined by any suitable method. For example, there may be two methods for measuring the fluorescence quantum yield or efficiency: the absolute method and the relative method.

The absolute method directly obtains the quantum yield by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on the photoluminescence ("PL") wavelengths thereof, but are not limited thereto.

A bandgap energy of a semiconductor nanoparticle may vary with a size and a composition of a nanocrystal. For example, as a size of the semiconductor nanoparticle increases, the bandgap energy of the semiconductor nanoparticle may become smaller, e.g., narrower, and the semiconductor nanoparticle may emit light of, e.g., having an increased emission wavelength. A semiconductor nanocrystal may be used as a light emitting material in various fields of, e.g., such as in, a display device, an energy device, or a bio light emitting device.

A semiconductor nanoparticle based electroluminescent device (hereinafter, also referred to as a QD-LED) may emit light by applying a voltage and includes a semiconductor nanoparticle or a quantum dot as a light emitting material. A QD-LED, which uses a different emission principle than an organic light emitting diode ("OLED"), may exhibit light emission with more desirable optical properties, e.g., higher purity color (e.g., red, green, and blue) and improved color reproducibility, and therefore, may be the basis for a next generation display device. A method of producing a QD-LED may include a solution process, which may lower, e.g., reduce, a manufacturing cost. In addition, semiconductor nanoparticles in a QD-LED may be based on an inorganic material, contributing to realization of increased display (light emission) stability over time. It is still desired to develop a technology capable of improving a property or a life span characteristic of the device.

In the QD-LED of an embodiment, holes and electrons provided from the two electrodes (e.g., a cathode and an anode) and passing through several common layers may meet and combine in the emission layer (EML, Emitting layer, QD emission layer) to form excitons resulting in light emission. In an embodiment of the QD-LED, common layers may be provided between the light emitting layer and the electrode, e.g., to facilitate injection of holes and electrons as a voltage is applied, and thus the design of these common layers may have an effect on properties (e.g., optical or stability property) of the device.

In addition, a quantum dot or a semiconductor nanoparticle exhibiting a desirable electroluminescent property may contain a harmful heavy metal such as cadmium (Cd), lead, mercury, or a combination thereof. Accordingly, it may be desirable to provide an electroluminescent device or a display device including the same that includes a quantum dot layer or a light emitting layer substantially free of such a harmful heavy metal. In an embodiment, an electroluminescent device may be a device configured to emit a desired light by applying a voltage, for example, with or without a separate light source.

In an embodiment, an electroluminescent device includes a first electrode 11 and a second electrode 15 spaced apart each other (e.g., each having a surface opposite the other, i.e., each with a surface facing each other); and a light emitting layer 13 disposed between the first electrode 11 and the second electrode 15 and including a semiconductor nanoparticle population, and an electron transport layer 14 (or an electron auxiliary layer including the same) disposed between the light emitting layer 13 and the second electrode 15. In an embodiment, the electroluminescent device may further include a hole auxiliary layer 12 between the light emitting layer 13 and the first electrode 11. The hole auxiliary layer may include a hole transport layer, a hole injection layer, or a combination thereof. The hole auxiliary layer may include an organic compound. (See FIG. 1A)

The semiconductor nanoparticle population includes a quantum dot (e.g., a plurality of quantum dots). The semiconductor nanoparticle population may further include an inorganic nanoparticle (e.g., a plurality of inorganic nanoparticles). The semiconductor nanoparticle population may show, e.g., exhibit, a multimodal (e.g., bimodal) distribution including a first peak particle size and a second peak particle size. The second peak particle size may be greater than the first peak particle size. The first peak particle size or a size (or an average size, hereinafter, it can be simply referred to as "size") of the inorganic nanoparticle may be in a range of from about 2 nm to 15 nm, from about 3 nm to about 7 nm, from about 4 nm to about 6 nm, from about 5 nm to about 5.8 nm, or a combination thereof. The quantum dot may include a first semiconductor nanocrystal. The inorganic nanoparticle may include a metal chalcogenide. A bulk bandgap energy of the metal chalcogenide or a bulk bandgap energy of inorganic nanoparticle may be greater than the bandgap energy of the first semiconductor nanocrystal or an optical energy of the first light, for example, by greater than or equal to about 0.1 eV (e.g., greater than or equal to about 0.15 eV, greater than or equal to about 0.2 eV, greater than or equal to about 0.25 eV, or greater than or equal to about 0.5 eV). The metal chalcogenide or the inorganic nanoparticle may have (or exhibit) a bandgap energy of greater than or equal to about 2.9 eV, for example, greater than or equal to about 3.4 eV or greater than or equal to about 3.5 eV and less than or equal to about 10 eV.

Figure 1B:
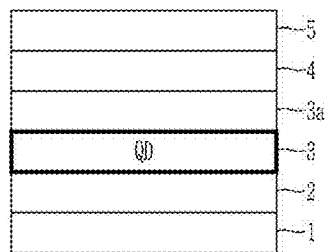
FIG. 1B is a schematic cross-sectional view of an embodiment of an electroluminescent device.

Referring to a drawing explaining the structure of an electroluminescent device of an embodiment, the light emitting layer 13 or the electroluminescent device may include a quantum dot ("QD") layer 3; and a first layer (3a) disposed between the electron transport layer (or an electron auxiliary layer including the electron transport layer, 14, 40) and the quantum dot layer and including the (plurality of the) inorganic nanoparticle(s). (see FIG. 1B)

Figure 1C:
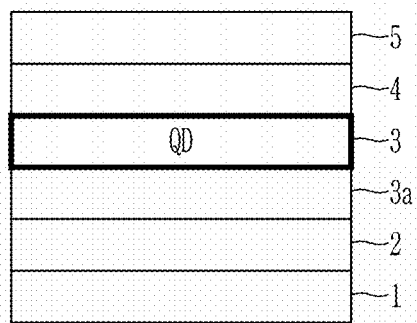
FIG. 1C is a schematic cross-sectional view of an embodiment of an electroluminescent device.

Referring to a drawing explaining the structure of an electroluminescent device of an embodiment, the light emitting layer 13 or the electroluminescent device may include a quantum dot ("QD") layer 3; and a first layer (3a) disposed between the hole transport layer (or a hole auxiliary layer including the electron transport layer, 12, 20) and the quantum dot layer and including the (plurality of the) inorganic nanoparticle(s). (see FIG. 1C)

In an embodiment, the light emitting layer 13 or the quantum dot layer 3 may be configured to emit a first light. For example, the semiconductor nanoparticle population or the quantum dot may be configured to emit the first light.

An additional electron auxiliary layer (e.g., an electron injection layer, a hole blocking layer, or a combination thereof) may be further disposed between the second electrode 15 and the electron transport layer 14 (or the light emitting layer 13). The electroluminescent device may further include a hole auxiliary layer 12 between the light emitting layer 13 and the first electrode 11. The hole auxiliary layer may include a hole transport layer (including, for example, an organic compound), a hole injection layer, or a combination thereof. (See FIG. 1A and FIG. 1B)

Figure 2A:
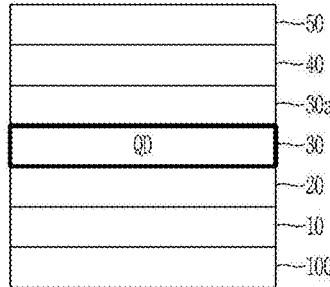
FIG. 2A is a schematic cross-sectional view of an embodiment of an electroluminescent device.

The first electrode or the second electrode may include an anode or a cathode. The first electrode may include an anode, and the second electrode may include a cathode. The first electrode may include a cathode and the second electrode may include an anode. In an embodiment, the second electrode includes a cathode. In the electroluminescent device of an embodiment or a display device including the same, the first electrode 10 or the second electrode 50 may be disposed on a (transparent) substrate 100 (see FIG. 2A and FIG. 2B). The transparent substrate may be a light extraction surface. The light emitting layer or the quantum dot layer may be disposed in a pixel (or a subpixel) of a display device (e.g., display panel) described herein.

In an electroluminescent device of an embodiment, a light emitting layer 13 (e.g., a quantum dot layer 30) may be disposed between the first electrode (e.g., an anode) 1, 11, 10 and the second electrode (e.g., a cathode) 5, 15, 50. The cathode 5, 15, 50 may include an electron injection conductor. The anode 1, 11, 10 may include a hole injection conductor. The work functions of the electron/hole injection conductors included in the cathode and the anode may be appropriately adjusted and are not particularly limited. For example, the cathode may have a small work function and the anode may have a relatively large work function, or vice versa.

The electron/hole injection conductors may include a metal-based material (e.g., a metal, a metal compound, an alloy, or a combination thereof) such as aluminum, magnesium, tungsten, nickel, cobalt, platinum, palladium, calcium, LiF, etc.; a metal oxide such as gallium indium oxide or indium tin oxide ("ITO"); or a conductive polymer (e.g., having a relatively high work function) such as polyethylene dioxythiophene, but are not limited thereto.

The first electrode, the second electrode, or a combination thereof may be a light-transmitting electrode or a transparent electrode. In an embodiment, both the first electrode and the second electrode may be a light-transmitting electrode. The first electrode, the second electrode, or a combination thereof may be patterned electrodes.

The first electrode, the second electrode, or a combination thereof may be disposed on a (e.g., insulating) substrate 100. The substrate 100 may be a substrate including an insulating material. The substrate may include glass; various polymers such as a polyester of polyethylene terephthalate ("PET"), polyethylene naphthalate ("PEN"), and the like, polycarbonate, and polyacrylate; a polysiloxane (e.g., polydimethylsiloxane ("PDMS")); an inorganic material such as $Al_2O_3$ or ZnO; or a combination thereof but is not limited thereto. A thickness of the substrate may be appropriately selected taking into consideration a substrate material but is not particularly limited. The substrate may be a flexible substrate. The substrate 100 may be optically transparent (e.g., may have a light transmittance of greater than or equal to about 50%, greater than or equal to about 60%, greater than or equal to about 70%, greater than or equal to about 80%, greater than or equal to about 85%, or greater than or equal to about 90% and, for example, less than or equal to about 99%, or less than or equal to about 95%). The substrate may have a transmittance of greater than or equal to about 50%, greater than or equal to about 60%, greater than or equal to about 70%, greater than or equal to about 80%, or greater than or equal to about 90% for light emitted from semiconductor nanoparticles that are described herein. The substrate 100 may include a region for a blue pixel, a region for a red pixel, a region for a green pixel, or a combination thereof.

In an embodiment, a thin film transistor may be disposed in each region of the substrate, but it is not limited thereto. In an embodiment, a source electrode or a drain electrode of the thin film transistor may be electrically connected to the first electrode or the second electrode. In an embodiment, the light-transmitting electrode may be disposed on a (e.g., insulating) transparent substrate. The substrate 100 may be a rigid or a flexible substrate.

The light-transmitting electrode may be made of, for example, a transparent conductor such as indium tin oxide ("ITO") or indium zinc oxide ("IZO"), gallium indium tin oxide, zinc indium tin oxide, titanium nitride, polyaniline, LiF/Mg:Ag, or the like, or a metal thin film of a single layer or a plurality of layers but is not limited thereto. In an embodiment, one of the first electrode or the second electrode may be an opaque electrode, the opaque electrode may be made of an opaque conductor such as aluminum (Al), a lithium-aluminum (Li:Al) alloy, a magnesium-silver (Mg:Ag) alloy, or lithium fluoride-aluminum (LiF:Al).

The thickness of each electrode (the first electrode, the second electrode, or a combination thereof) is not particularly limited and may be appropriately selected taking into consideration device efficiency. For example, the thickness of the electrode may be greater than or equal to about 5 nm, greater than or equal to about 10 nm, greater than or equal to about 20 nm, greater than or equal to about 30 nm, greater than or equal to about 40 nm, or greater than or equal to about 50 nm. For example, the thickness of the electrode may be less than or equal to about 100 micrometers (µm), less than or equal to about 90 µm, less than or equal to about 80 µm, less than or equal to about 70 µm, less than or equal to about 60 μm, less than or equal to about 50 μm, less than or equal to about 40 μm, less than or equal to about 30 μm, less than or equal to about 20 μm, less than or equal to about 10 μm, less than or equal to about 1 μm, less than or equal to about 900 nm, less than or equal to about 500 nm, or less than or equal to about 100 nm.

A light emitting layer 13 (e.g., a quantum dot layer 30) may be disposed between the first electrode (e.g., an anode) 1, 11, 10 and the second electrode (e.g., a cathode) 5, 15, 50. The light emitting layer 13 or the quantum dot layer QD may include a semiconductor nanoparticle population (e.g., a plurality of semiconductor nanoparticles) and the semiconductor nanoparticle population may include a quantum dot (or a quantum dot population). The quantum dot may be a blue light emitting quantum dot. The quantum dot may be a red light emitting quantum dot. The quantum dot may be a green light emitting quantum dot. In an embodiment, the semiconductor nanoparticles or the semiconductor nanoparticle population may not comprise cadmium. The light emitting layer 13 or the quantum dot layer 3 may include one or more (e.g., 2 or more or 3 or more and 10 or less) monolayers of the plurality of quantum dots.

The light emitting layer or the quantum dot layer may be patterned (not shown). In an embodiment, the light emitting layer or the quantum dot layer may be patterned via an ink jet printing method, but is not limited thereto. In an embodiment, the patterned light emitting layer may include, for example, a blue light emitting layer disposed in the blue pixel of a display device, a red light emitting layer disposed in the red pixel of a display device, a green light emitting layer disposed in the green pixel of a display device, or a combination thereof. Each of the (e.g., red, green, or blue) light emitting layers may be (e.g., optically) separated from an adjacent light emitting layer by a partition wall. In an embodiment, partition walls such as black matrices or banks may be disposed between the red light emitting layer, the green light emitting layer, and the blue light emitting layer. The red light emitting layer, the green light emitting layer, and the blue light emitting layer may be optically isolated from each other.

In an embodiment, the light emitting layer (or the quantum dot layer) or the semiconductor nanoparticle population may not include cadmium. In an embodiment, the light emitting layer (or the quantum dot layer) or the semiconductor nanoparticle population may not include mercury, lead, or a combination thereof.

In an embodiment, the quantum dot may include a first semiconductor nanocrystal and optionally a second semiconductor nanocrystal. The quantum dot may have a core-shell structure. In an embodiment, the quantum dot or the core-shell structure may include a core including a first semiconductor nanocrystal and a shell disposed on the core and including a second semiconductor nanocrystal having a composition different from that of the first semiconductor nanocrystal.

The quantum dot (or the first semiconductor nanocrystal, the second semiconductor nanocrystal, or a combination thereof) may include a Group II-VI compound, a Group III-V compound, a Group IV-VI compound, a Group IV element or compound, a Group compound, a Group compound, a Group I-II-IV-VI compound, or a combination thereof. In an embodiment, the light emitting layer (or the quantum dot layer) or the quantum dot (e.g., the first semiconductor nanocrystal or the second semiconductor nanocrystal) may not include a harmful heavy metal such as cadmium, lead, mercury, or a combination thereof.

The Group II-VI compound may be a binary element compound such as ZnS, ZnSe, ZnTe, ZnO, HgS, HgSe, HgTe, MgSe, MgS, or a combination thereof; a ternary element compound such as ZnSeS, ZnSeTe, ZnSTe, HgSeS, HgSeTe, HgSTe, HgZnS, HgZnSe, HgZnTe, MgZnSe, MgZnS, or a combination thereof; a quaternary element compound such as HgZnTeS, HgZnSeS, HgZnSeTe, HgZnSTe, or a combination thereof; or a combination thereof. The Group II-VI compound may further include a Group III metal.

The Group III-V compound may be a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof; or a combination thereof. The Group III-V compound may further include a Group II metal (e.g., InZnP).

The Group IV-VI compound may be a binary element compound such as SnS, SnSe, SnTe, PbS, PbSe, PbTe, or a combination thereof; a ternary element compound such as SnSeS, SnSeTe, SnSTe, PbSeS, PbSeTe, PbSTe, SnPbS, SnPbSe, SnPbTe, or a combination thereof; a quaternary element compound such as SnPbSSe, SnPbSeTe, SnPbSTe, or a combination thereof; or a combination thereof.

Examples of the Group compound may be $CuInSe_2$, $CuInS_2$, CuInGaSe, and CuInGaS, but are not limited thereto.

Examples of the Group I-II-IV-VI compound may be CuZnSnSe, and CuZnSnS, but are not limited thereto.

The Group IV element or compound may include a single element such as Si, Ge, or a combination thereof; a binary element compound such as SiC, SiGe, or a combination thereof; or a combination thereof.

In an embodiment, the quantum dot or the first semiconductor nanocrystal may include a metal including indium, zinc, or a combination thereof and a non-metal including phosphorus, selenium, tellurium, sulfur, or a combination thereof. In an embodiment, the quantum dot or the second semiconductor nanocrystal may include a metal including indium, zinc, or a combination thereof, and a non-metal including phosphorus, selenium, tellurium, sulfur, or a combination thereof.

In an embodiment, a first semiconductor nanocrystal may include InP, InZnP, ZnSe, ZnSeS, ZnSeTe, or a combination thereof; the second semiconductor nanocrystal may include ZnSe, ZnSeS, ZnS, ZnTeSe, or a combination thereof. In an embodiment, the shell may include zinc, sulfur, and optionally selenium in the outermost layer.

In an embodiment, the quantum dot may emit blue or green light and may include a core including ZnSeTe, ZnSe, or a combination thereof and a shell including a zinc chalcogenide (e.g., ZnS, ZnSe, ZnSeS, or a combination thereof). An amount of sulfur in the shell may increase or decrease in a radial direction (from the core toward the surface), e.g., the amount of sulfur may have a concentration gradient wherein the concentration of sulfur varies radially (e.g., decreases or increases in a direction toward the core).

In an embodiment, the quantum dot may emit red or green light, the core may include InP, InZnP, or a combination thereof, and the shell may include a Group II metal including zinc and a non-metal including sulfur, selenium, or a combination thereof.

In an embodiment, the quantum dot may have a core-shell structure, and at an interface between the core and the shell, an alloyed interlayer may exist or may not exist. The alloyed interlayer layer may include a homogeneous alloy or may have a concentration gradient. The gradient alloy may have a concentration gradient wherein the concentration of an element of the shell varies radially (e.g., decreases or increases in a direction toward the core).

In an embodiment, the shell may have a composition that varies in a radial direction. In an embodiment, the shell may be a multilayered shell including two or more layers. In a multilayered shell, adjacent two layers may have different compositions from each other. In a multilayered shell, a, e.g., at least one, layer may independently include a semiconductor nanocrystal having a single composition. In a multilayered shell, a, e.g., at least one, layer may independently have an alloyed semiconductor nanocrystal. In a multilayered shell, a, e.g., at least one, layer may have a concentration gradient that varies radially in terms of a composition of a semiconductor nanocrystal.

In an embodiment, in a quantum dot having a core-shell structure, a shell material may have a bandgap energy that is larger, e.g., greater, than that of the core. The materials of the shell may have a bandgap energy that is smaller, e.g., less, than that of the core. In the case of a multilayered shell, the bandgap energy of the outermost layer material of the shell may be greater than the bandgap energies of the core and the inner layer material of the shell (layers that are closer to the core). In the case of a multilayered shell, a semiconductor nanocrystal of each layer is selected to have an appropriate bandgap, thereby effectively showing, e.g., exhibiting, a quantum confinement effect.

The quantum dot according to an embodiment may include, for example, an organic ligand, an organic solvent, or a combination thereof, which is bound or coordinated to a surface thereof.

An absorption/emission wavelength of the quantum dot may be controlled by adjusting the compositions, sizes, or a combination thereof of the quantum dot. The quantum dot included in the light emitting layer 13 or the quantum dot layer 30 may be configured to emit light of a desired color (i.e., a first light).

In an embodiment, the quantum dot or a light emission layer (or the light emitted from the electroluminescent device) may have a peak emission wavelength in a wavelength range of from ultraviolet to infrared. In an embodiment, the peak emission wavelength may be greater than or equal to about 300 nm, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The peak emission wavelength may be less than or equal to about 900 nm, less than or equal to about 800 nm, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The peak emission wavelength may be from about 500 nm to about 650 nm.

The quantum dot (or the light emitting layer) may emit green light (for example, on an application of a voltage or irradiation with light). A peak emission wavelength of the green light may be in the range of greater than or equal to about 500 nm (for example, greater than or equal to about 510 nm, greater than or equal to about 515 nm, greater than or equal to about 520 nm, or greater than or equal to about 525 nm) and less than or equal to about 560 nm, for example, less than or equal to about 540 nm, or less than or equal to about 530 nm. The quantum dot (or the light emitting layer) may emit red light, (for example, on an application of voltage or irradiation with light), and a peak emission wavelength of the red light may be in the range of greater than or equal to about 600 nm, for example, greater than or equal to about 610 nm and less than or equal to about 650 nm, or less than or equal to about 640 nm. The quantum dot (or the light emitting layer) may emit blue light, (for example, on an application of voltage or irradiation with light) and a peak emission wavelength thereof may be greater than or equal to about 430 nm (for example, greater than or equal to about 450 nm, greater than or equal to about 455 nm, greater than or equal to about 460 nm, or greater than or equal to about 465 nm) and less than or equal to about 480 nm (for example, less than or equal to about 475 nm, less than or equal to about 470 nm, or less than or equal to about 465 nm).

In an embodiment, the quantum dot or the first light may exhibit a luminescent spectrum (e.g., photo- or electroluminescent spectrum) with a relatively narrow full width at half maximum. In an embodiment, in the photo- or electroluminescent spectrum, the semiconductor nanoparticle may exhibit a full width at half maximum of less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, or less than or equal to about 30 nm. The full width at half maximum may be greater than or equal to about 10 nm, greater than or equal to about 15 nm, greater than or equal to about 20 nm, or greater than or equal to about 25 nm.

The quantum dot may exhibit (or may be configured to exhibit) a quantum efficiency (or quantum yield) of greater than or equal to about 10%, for example, greater than or equal to about 30%, greater than or equal to about 50%, greater than or equal to about 60%, greater than or equal to about 70%, greater than or equal to about 80%, greater than or equal to about 90%, or about 100%.

The quantum dot may have a size (or an average size, hereinafter, "size") of greater than or equal to about 1 nm and less than or equal to about 100 nm. The size may be a diameter or equivalent diameter converted by assuming a spherical shape from an electron microscope image when not spherical. The size may be calculated from a result of an inductively coupled plasma atomic emission spectroscopy ("ICP-AES") analysis. In an embodiment, the quantum dot may have a size of from about 1 nm to about 50 nm, for example, from about 2 nm (or about 3 nm) to about 35 nm. In an embodiment, a size (or an average size) of the quantum dot may be greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, or greater than or equal to about 12 nm. In an embodiment, a size of the quantum dot may be less than or equal to about 50 nm, less than or equal to about 40 nm, less than or equal to about 30 nm, less than or equal to about 25 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, or less than or equal to about 12 nm.

The shape of the quantum dot is not particularly limited. For example, the shape of the quantum dot may include, but is not limited to, a sphere, a polyhedron, a pyramid, a multi-pod shape, a hexahedron, a cube, a cuboid, a nanotube, a nanorod, a nanowire, a nanosheet, or a combination thereof.

The quantum dot may be prepared in an appropriate method. In an embodiment, the quantum dot may be prepared for example by a chemical wet method wherein a semiconductor nanocrystal may grow by a reaction between precursors in a reaction system including an organic solvent and an organic ligand. The organic ligand or the organic solvent may coordinate (with or to) a surface of the semiconductor nanocrystal to control the growth thereof.

In an embodiment, for example, the method of preparing the quantum dot having a core/shell structure may include obtaining the core; reacting a metal precursor including a metal (e.g., zinc) and a non-metal precursor including a non-metal element (e.g., selenium, sulfur, or a combination thereof) in the presence of the core in a reaction medium including an organic ligand and an organic solvent at a reaction temperature (e.g., of greater than or equal to about 180° C., greater than or equal to about 200° C., greater than or equal to about 240° C., or greater than or equal to about 280° C. and less than or equal to about 360° C., less than or equal to about 340° C., or less than or equal to about 320° C.) to form a shell including a second semiconductor nanocrystal on a core including a first semiconductor nanocrystal. In the quantum dot of an embodiment, the core may be prepared in an appropriate manner. The method may further include separating a core from a reaction system producing the same and dispersing the core in an organic solvent to obtain a core solution.

In an embodiment, in order to form the shell, a solvent and optionally, the metal precursor and a ligand compound may be heated at a predetermined temperature (e.g., greater than or equal to about 100° C.) under vacuum (also referred to herein as vacuum-treated) and then, after introducing an inert gas into the reaction vessel, the mixture may be heat-treated again at a predetermined temperature (e.g., greater than or equal to about 100° C.). Then, the core and the non-metal precursor may be added to the mixture and heated at a reaction temperature. The shell precursors may be added at different ratios during a reaction time simultaneously or sequentially.

In an embodiment, the organic solvent may include a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) substituted with a, e.g., at least one (e.g., 1, 2, or 3), C6 to C22 alkyl group, a phosphine oxide (e.g., trioctylphosphine oxide) substituted with a (e.g., 1, 2, or 3) C6 to C22 alkyl group, a C12 to C22 aromatic ether such as phenyl ether or benzyl ether, or a combination thereof. A combination including more than one type of organic solvent may be used.

The organic ligand or the organic solvent may coordinate surfaces of the prepared quantum dot. The organic ligand may allow the quantum dots to be well dispersed in the solution. The organic ligand may include RCOOH, $RNH_2$, $R_2NH$, $R_3N$, RSH, $RH_2PO$, $R_2H_PO$, $R_3PO$, $RH_2P$, $R_2HP$, $R_3P$, ROH, RCOOR', $RPO(OH)_2$, $R_2POOH$ or a combination thereof. Herein, R and R' are each independently a substituted or unsubstituted, C3 or greater, C6 or greater, or C10 or greater and about C40 or less, C35 or less, or C25 or less, aliphatic hydrocarbon group (e.g., alkyl, alkenyl, alkynyl, etc.), a substituted or unsubstituted C6 to C40 aromatic hydrocarbon group (e.g., aryl group), or a combination thereof. In an embodiment, at least two different organic ligands may be used.

The metal precursor may include a metal powder, an alkylated metal, a metal alkoxide, a metal carboxylate, a metal halide, a metal cyanide, a metal hydroxide, a metal oxide, a metal nitrate, a metal perchlorate, a metal acetylacetonate, a metal peroxide, a metal carbonate, or a combination thereof, but is not limited thereto. The metal precursor may include a zinc precursor, an indium precursor, or a combination thereof. The zinc precursor may be a Zn metal powder, an alkylated Zn compound, Zn alkoxide, Zn carboxylate, Zn nitrate, Zn perchlorate, Zn sulfate, Zn acetylacetonate, Zn halide, Zn cyanide, Zn hydroxide, Zn oxide, Zn peroxide, or a combination thereof. The indium precursor may include an indium powder, alkylated indium compound, indium alkoxide, indium carboxylate, indium nitrate, indium perchlorate, indium sulfate, indium acetylacetonate, indium halide, indium cyanide, indium hydroxide, indium oxide, indium peroxide, indium carbonate, or a combination thereof.

The non-metal precursor may include a chalcogen precursor (e.g., selenium precursor, a sulfur precursor, a tellurium precursor, or a combination thereof) or a phosphorus precursor. In an embodiment, the selenium precursor may be selenium-trioctylphosphine ("Se-TOP"), selenium-tributylphosphine ("Se-TBP"), selenium-triphenylphosphine ("Se-TPP"), selenium-diphenylphosphine ("Se-DPP"), or a combination thereof, but is not limited thereto. In an embodiment, the sulfur precursor may include mercapto propyl silane, sulfur-trioctylphosphine ("S-TOP"), sulfur-tributylphosphine ("S-TBP"), sulfur-triphenylphosphine ("S-TPP"), sulfur-trioctylamine ("S-TOA"), bis(trimethylsilyl) sulfide, bis(trimethylsilyl)methyl sulfide, ammonium sulfide, sodium sulfide, or a combination thereof, but is not limited thereto. A phosphorus precursor may include tris(trimethylsilyl) phosphine, tris(dimethylamino)phosphine, triethylphosphine, tributylphosphine, trioctylphosphine, triphenylphosphine, tricyclohexylphosphine, dimethylaminophosphine, diethylaminophosphine, or a combination thereof, but is not limited thereto. A tellurium precursor may include tellurium-trioctylphosphine ("Te-TOP"), tellurium-tributylphosphine ("Te-TBP"), tellurium triphenylphosphine ("Te-TPP"), tellurium diphenylphosphine ("Te-DPP"), or a combination thereof, but is not limited thereto.

In an embodiment, after completing the reaction (for the formation of the core or for the formation of the shell), a nonsolvent is added to reaction products and a nanoparticle coordinated with the ligand compound may be separated. The nonsolvent may be a polar solvent that is miscible with the solvent used in the core formation reactions, shell formation reaction, or a combination thereof and is not capable of dispersing the prepared nanocrystals. The non-solvent may be selected depending on the solvent used in the reaction and may include, for example, acetone, ethanol, butanol, isopropanol, ethanediol, water, tetrahydrofuran ("THF"), dimethylsulfoxide ("DMSO"), diethylether, form-aldehyde, acetaldehyde, a solvent having a similar solubility parameter to the foregoing nonsolvents, or a combination thereof. The quantum dot may be separated through cen-trifugation, sedimentation, or chromatography. The sepa-rated nanocrystals may be washed with a washing solvent, if desired. The washing solvent has no particular limit and may have a similar solubility parameter to that of the ligand and may, for example, include hexane, heptane, octane, chloroform, toluene, benzene, and the like.

The quantum dot of an embodiment may be non-dispers-ible or insoluble in water, the aforementioned nonsolvent, or a combination thereof. The quantum dot of an embodiment may be dispersed in the aforementioned organic solvent. In an embodiment, the aforementioned quantum dot may be dispersed in a C6 to C40 aliphatic hydrocarbon, a substituted or unsubstituted C6 to C40 aromatic hydrocarbon, or a combination thereof.

The prepared quantum dot may be treated with a halogen compound. By the treatment with the halogen compound, at least a portion of the organic ligand may be replaced with the halogen. The halogen treated quantum dot may include a reduced amount of the organic ligand. The halogen treat-ment may be carried out contacting the quantum dot with the halogen compound (e.g., a metal halide such as a zinc chloride) at a predetermined temperature of from about 30° C. to about 100° C. or from about 50° C. to about 150° C. in an organic solvent. The halogen-treated quantum dot may be separated using the nonsolvent described above.

In an embodiment, the quantum dot layer 30 may not include an inorganic particle as described herein. In an embodiment, the quantum dot layer 30 may further include the inorganic particles.

In the display device or the light emitting device, design-ing of the light emitting layer may have a substantial effect on the luminescent properties and lifespan of the device. For example, regarding a quantum dot contained in the light emitting layer (e.g., cadmium-based quantum dots), research has been conducted on a core, a shell, a quality of a shell coating, a shell thickness, or a ligand. However, the present inventors have found that despite a variety of approaches according to conventional technologies, providing a desired level of electroluminescence and lifespan at the same time may still be challenging for a harmful heavy metal free quantum dot (e.g., a cadmium free quantum dot) that emits desired wavelengths.

Cadmium free quantum dots may include indium phos-phide or a zinc chalcogenide as a light emitting center, but the InP or the zinc chalcogenide may have some techno-logical drawbacks in emitting light of a desired wavelength (e.g., blue light) with desired luminescent properties, for example, and without wishing to be bound by any theory, in light of a bandgap energy engineering. A ZnTeSe based quantum can emit blue light of the desired wavelength. However, an electroluminescent device including a quantum dot including the same in its core still has difficulty in achieving a desired level of an electroluminescence property together with lifespan. Without wishing to be bound by any theory, a light emitting principle of a quantum dot is based on a quantum confinement effect but a zinc chalcogenide shell (e.g., a ZnSe/ZnS shell) disposed on the core may not provide a sufficiently effective confinement for the electrons within the core. Therefore, the synthesized quantum dot may include various trap energy levels, which may result in a charging phenomenon in the electroluminescent device and make it difficult to increase the electroluminescent property and the lifespan property at the same time.

The electroluminescent device of an embodiment further includes a plurality of inorganic nanoparticles in the semi-conductor nanoparticle population included in the light emitting layer 13. In an embodiment, the light emitting layer 13 of the electroluminescent device may include a quantum dot layer 3 and 30 and a first layer 3a and 30a, wherein the plurality of quantum dots may be placed (or disposed) in the quantum dot layer 3 and 30, and the inorganic nanoparticles may be included in the first layer 3a and 30a. The light emitting layer 13 or the semiconductor nanoparticle popu-lation may exhibit a multimodal distribution (for example, a bimodal distribution) including a first peak particle size and a second peak particle size, and the second peak particle size may be greater than the first peak particle size, and the first peak particle size may be greater than or equal to about 2 nm and less than or equal to about 15 nm.

Figure 3A:
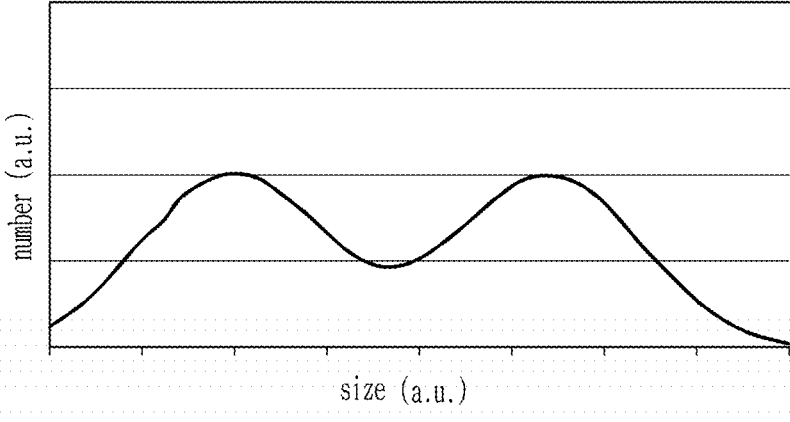
FIG. 3A is a graph of number (arbitrary units (a.u.)) versus size (a.u.) showing a size distribution (e.g., a bimodal distribution) of the semiconductor nanoparticle population included in the light emitting layer of the device according to an embodiment.

The multi-modal distribution may be a statistical distri-bution having two or more different modes. The multi-modal distribution may be a bimodal distribution having two peaks (or modes). In the multi-modal distribution, the different peaks (modes) may form local maxima, respectively. The local maximum or the mode refers to a point where the frequency (or the number) stops increasing and starts decreasing (see FIG. 3A and FIG. 3B).

The multi-modal distribution of the nanoparticle popula-tion may indicate that a given population showing, e.g., exhibiting, the same is a mixture of at least two (or more) different populations each having a normal distribution (e.g., showing, e.g., exhibiting, a bell-curved probability distribu-tion function). In an embodiment, the multi-modal distribu-tion may be represented by a probability distribution func-tion, which is an equally-weighted average of the bell-shaped probability distribution functions of the two normal distributions (see FIG. 3A). In an embodiment, in the multi-modal distribution, two modes (peaks) may not be the same, having different heights (greater frequencies, i.e., greater numbers), and a higher mode may be referred to as a major mode and the other mode may be referred to as a minor mode (see FIG. 3B).

The inorganic nanoparticle included in the semiconductor nanoparticle population and the light emitting layer 13 have a composition different from that of the zinc oxide nanopar-ticle and the quantum dot (e.g., the first semiconductor nanocrystal).

The inorganic nanoparticle may include a metal chalco-genide. The metal chalcogenide may include a metal and a chalcogen element (e.g., sulfur, selenium, tellurium, or a combination thereof). The chalcogen element does not include oxygen. The inorganic nanoparticles may be pre-pared by a chemical wet method using suitable precursors and may include a ligand on the surface thereof. The ligand compound is the same as described herein.

In an embodiment, the inorganic nanoparticle or the metal chalcogenide included therein may exhibit a bandgap energy that is greater than an optical energy of the first light. The bandgap energy of the metal chalcogenide or the inorganic nanoparticle may be greater than a bandgap energy of the first semiconductor nanocrystal.

In an embodiment, the bandgap energy of the metal chalcogenide or the inorganic nanoparticle may be greater than or equal to about 2.9 eV, greater than or equal to about 3.2 eV, greater than or equal to about 3.3 eV, greater than or equal to about 3.37 eV, greater than or equal to about 3.4 eV, greater than or equal to about 3.45 eV, greater than or equal to about 3.5 eV, greater than or equal to about 3.53 eV, greater than or equal to about 3.6 eV, greater than or equal to about 3.7 eV, and less than or equal to about 10 eV, less than or equal to about 6 eV, less than or equal to about 5 eV, less than or equal to about 4 eV, less than or equal to about 3.9 eV, or less than or equal to about 3.8 eV. The bandgap energy of the metal chalcogenide or the inorganic nanoparticle may be measured at an ambient temperature (for example, about 20° C. to about 30° C.). The bandgap energy of the inorganic nanoparticle may be determined by a light emitting property described herein.

In an embodiment, accordingly, the inorganic nanoparticles may be configured to emit light of a wavelength determined by the following equation:

$$1240/\text{Bandgap energy (eV)} = \text{wavelength (nm)}.$$

The (bandedge) peak emission wavelength of the inorganic nanoparticles may be less than or equal to about 428 nm, be less than or equal to about 427.59 nm, be less than or equal to about 427.5 nm, less than or equal to about 388 nm, less than or equal to about 365 nm, less than or equal to about 359 nm, less than or equal to about 354 nm, less than or equal to about 351 nm, less than or equal to about 340 nm, less than or equal to about 335 nm, or less than or equal to about 310 nm. The (bandgap) peak emission wavelength of the inorganic nanoparticles may be greater than or equal to about 124 nm, greater than or equal to about 207 nm, greater than or equal to about 248 nm, greater than or equal to about 270 nm, greater than or equal to about 295 nm, greater than or equal to about 335 nm, or greater than or equal to about 310 nm.

The bandgap energy of the inorganic nanoparticles or the metal chalcogenide may be greater than or equal to about 3.0 eV, greater than or equal to about 3.2 eV, greater than or equal to about 3.4 eV, greater than or equal to about 3.6 eV, greater than or equal to about 3.8 eV, greater than or equal to about 4 eV, greater than or equal to about 4.2 eV, greater than or equal to about 4.4 eV, greater than or equal to about 4.6 eV, greater than or equal to about 4.8 eV, or greater than or equal to about 5 eV. The bandgap energy of the inorganic nanoparticles or the metal chalcogenide may be less than or equal to about 7 eV, less than or equal to about 6.8 eV, less than or equal to about 6.4 eV, less than or equal to about 6.2 eV, less than or equal to about 6 eV, less than or equal to about 5.8 eV, or less than or equal to about 5.5 eV. For example, a zinc sulfide may exhibit a bandgap energy of from about 3.5 eV to about 3.9 eV, e.g., at room temperature.

A bandgap energy of the inorganic nanoparticle or the metal chalcogenide may be greater than a bandgap energy of the first semiconductor nanocrystal (or the optical energy of the first light). In an embodiment, a difference between a bandgap energy of the inorganic nanoparticle or the metal chalcogenide and a bandgap energy of the first semiconductor nanocrystal (or an optical energy of the first light) may be greater than or equal to about 0.1 eV, greater than or equal to about 0.2 eV, greater than or equal to about 0.3 eV, greater than or equal to about 0.4 eV, greater than or equal to about 0.5 eV, greater than or equal to about 0.7 eV, greater than or equal to about 0.9 eV, or greater than or equal to about 1 eV; less than or equal to about 3 eV, less than or equal to about 2.5 eV, or less than or equal to about 2.1 eV; or a combination thereof.

Surprisingly, the present inventors have found that by including the inorganic nanoparticle in the electroluminescent device in the manner described herein, a resulting device can exhibit an increased lifespan with improved electroluminescence properties. Without wishing to be bound by any theory, it is believed that the light emitting layer (or a combination of the QD layer and the first layer) can reduce electron transport channels linked to trap levels in the quantum dot. In addition, if an excess of holes are transported to the valance band of quantum dots, inorganic nanoparticles contained as described herein can reduce a leakage of an excess of holes in a band. In addition, the inorganic nanoparticles included in the manner described herein may not cause quenching that may be caused by an energy transition between the quantum dots and may suppress an increase in the electroluminescence wavelength.

In an embodiment, when being incorporated in the light emitting layer, the inorganic nanoparticles with a size and a composition described herein may not cause quenching of excitons generated in electroluminescent devices. In addition, the inorganic nanoparticles may have a wide bandgap energy so as not to absorb excitons generated from the quantum dot. The inorganic nanoparticle may be dispersed in a variety of solvents (e.g., alcohol) not substantially having an adverse effect on the formed quantum dot layer and thus may be formed as a first layer via, for example, a wet method (e.g., a solution process such as inkjet printing). In an embodiment of the electroluminescent device, it is believed that the inorganic nanoparticles contained in the first layer or the light emitting layer may reduce the probability of losing electron through the internal traps of the quantum dot included in the quantum dot layer or the light emitting layer, contributing to a realization of a more efficient electron transport in the device. The inorganic nanoparticle may have a deeper valence band than the quantum dot, which is surprisingly believed to help electron-hole recombination occur inside the light emitting layer by retarding the hole transportation to an adjacent electron transport layer, for example, when an excess of hole transportation happens, e.g., occurs, in the light emitting layer.

In addition, the present inventors have found that in case of the first semiconductor nanocrystal containing ZnTeSe, the energy transition between the quantum dots may occur more easily than a quantum dot of the other composition. In an embodiment, the inorganic nanoparticles are included in the light emitting layer, and the effective distance between the quantum dots may be increased and the energy transition between the quantum dots may be efficiently suppressed. Accordingly, the inorganic nanoparticles are arranged/disposed in the manner described herein, and the physical properties as the entire electroluminescent device may be improved.

Hereinafter, an arrangement of inorganic nanoparticles in the light emitting layer or the first layer will be explained in detail with reference to the drawings. Referring to FIG. 4A, FIG. 4B, FIG. 4C, FIG. 4D, FIG. 4E, and FIG. 4F, in the electroluminescent device of an embodiment, the first layer 3a may be disposed adjacent to the quantum dot layer 3. The light emitting layer 13 may include a quantum dot layer 3 and a first layer 3a. Although not illustrated, in an embodiment, the light emitting layer may include two quantum dot layers 3, and the first layer 3a may be disposed between the two quantum dot layers 3.

Figures 3B, 4A:
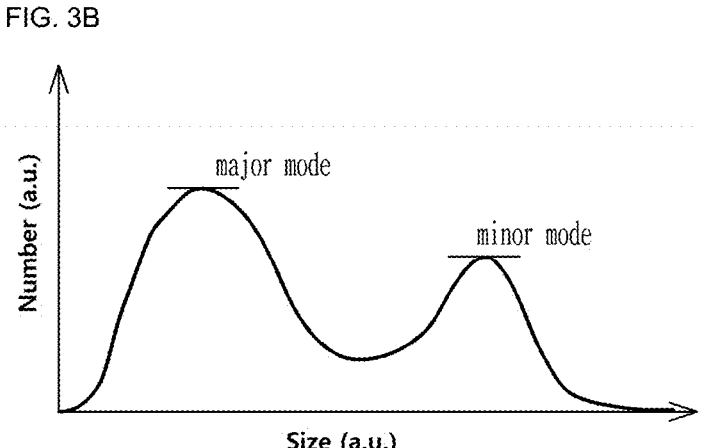
FIG. 3B is a graph of number (a.u.) versus size (a.u.) showing a size distribution (e.g., a bimodal distribution) of the semiconductor nanoparticle population included in the light emitting layer of the device according to an embodiment.
FIG. 4A illustrates a schematic cross-sectional view of an embodiment of a light emitting layer (a quantum dot layer and a first layer) in an electroluminescent device.

Referring to FIG. 4A, in an embodiment, the first layer 3a may not include a quantum dot.

Referring to FIG. 4B, FIG. 4C, FIG. 4D, FIG. 4E, and FIG. 4F, in an embodiment, the first layer 3a may further include a quantum dot (e.g., a plurality of quantum dots). The plurality of quantum dots (or a second quantum dot or a second quantum dot population) contained in the first layer 3a may be substantially the same (e.g., having the same composition or emitting light of the same color) as the quantum dots (a first quantum dot or a first quantum dot population) in the quantum dot layer. The first quantum dot (population) and the second quantum dot (population) may have substantially the same composition or may include the same type of the first semiconductor nanocrystal as a light emission center. The first quantum dot (population) and the second quantum dot (population) may have substantially the same peak emission wavelength or a difference therebetween may be less than or equal to about 20 nm, less than or equal to about 10 nm, less than or equal to about 5 nm, or less than or equal to about 1 nm. The light emitted from the light emitting layer for example, including the first quantum dot (population) and the second quantum dot (population) may have a full width at half maximum of less than or equal to about 50 nm, less than or equal to about 40 nm, less than or equal to about 30 nm, less than or equal to about 20 nm, or less than or equal to about 10 nm. The plurality of quantum dots (e.g., a second quantum dot) included in the first layer (3a) may have a composition different from that of the quantum dots (e.g., a first quantum dot) in the quantum dot layer and/or may emit light of a different color from that of the quantum dots in the quantum dot layer. Details of the quantum dots are the same as described herein.

In the electroluminescent device of an embodiment, the first layer 3a may include a first surface facing the quantum dot layer 3 and a second surface opposite to the first surface. In an embodiment, an electron auxiliary layer (e.g., an electron transport layer to be described herein) may be disposed on the second surface of the first layer. In an embodiment, a hole auxiliary layer (e.g., a hole transport layer described later) may be disposed on the second surface of the first layer.

In an embodiment of the electroluminescent device (e.g., in the light emitting layer 13 or in a combination of the first layer 3a and the quantum dot layer 3), details about the number of inorganic nanoparticles with respect to the number of quantum dots are the same as described for the multi-modal distribution.

In an embodiment of an electroluminescent device (e.g., in the first layer or in the light emitting layer 13), the inorganic nanoparticles may be randomly or uniformly distributed or may be distributed with a population density gradient in a cross-sectional direction. In the electroluminescent device of an embodiment, the inorganic nanoparticles may be uniformly distributed over the entire cross-section of the first layer 3a. (See FIG. 4A, FIG. 4B, FIG. 4C, and FIG. 4D). In the electroluminescent device of an embodiment, the inorganic nanoparticles may be distributed in a direction in which the population density of the inorganic nanoparticles increases or decreases as a distance from the quantum dot layer 3a increases. (See FIG. 4E and FIG. 4F) FIG. 4G, FIG. 4H, FIG. 4I, and FIG. 4J are schematic cross-sections of the light emitting layer 13 according to an embodiment.

Figure 4B:
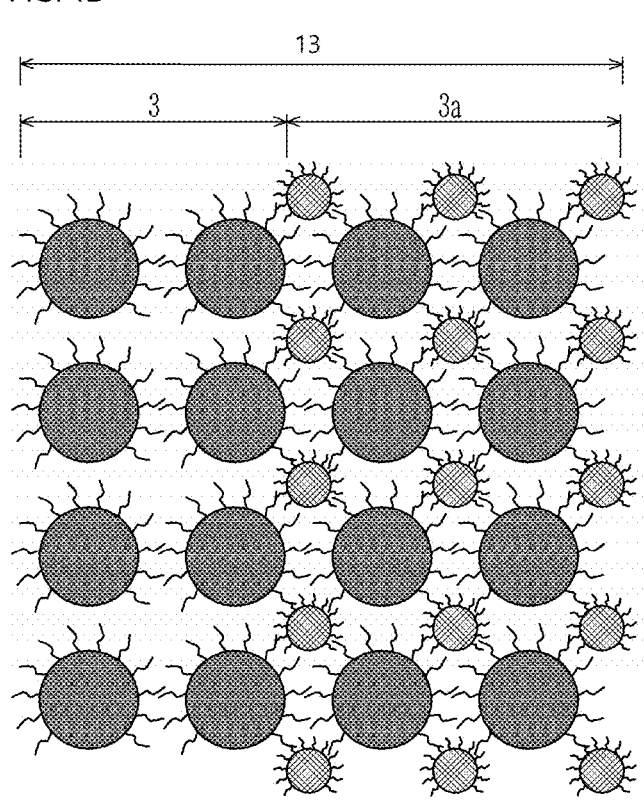
FIG. 4B illustrates a schematic cross-sectional view of an embodiment of a light emitting layer (a quantum dot layer and a first layer) in an electroluminescent device.
Figure 4C:
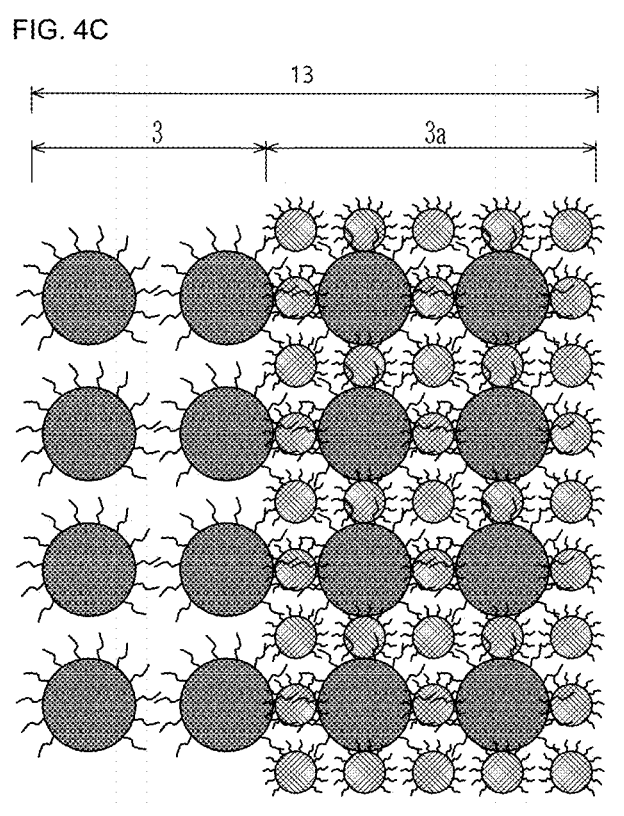
Figure 4D:
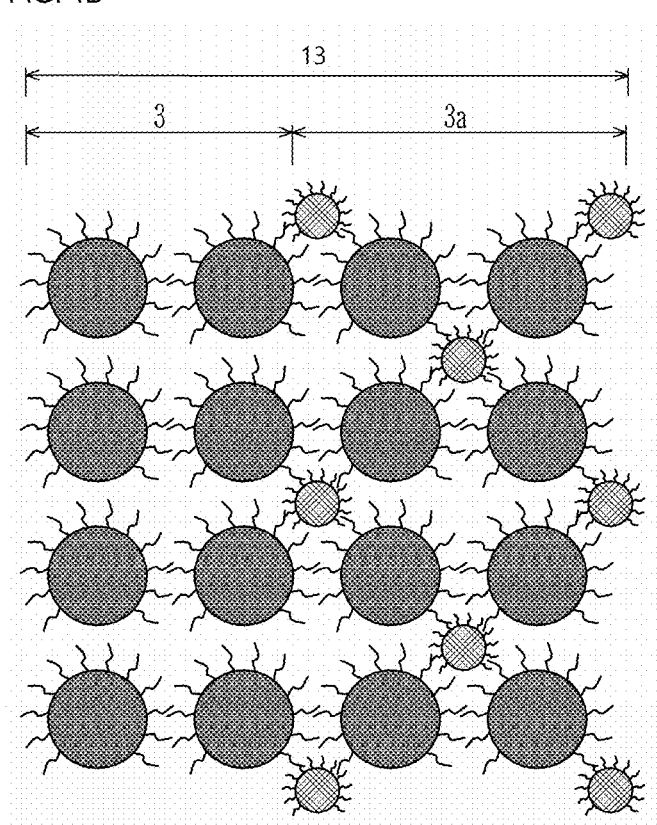
FIG. 4D illustrates a schematic cross-sectional view of an embodiment of a light emitting layer (a quantum dot layer and a first layer) in an electroluminescent device.
Figure 4E:
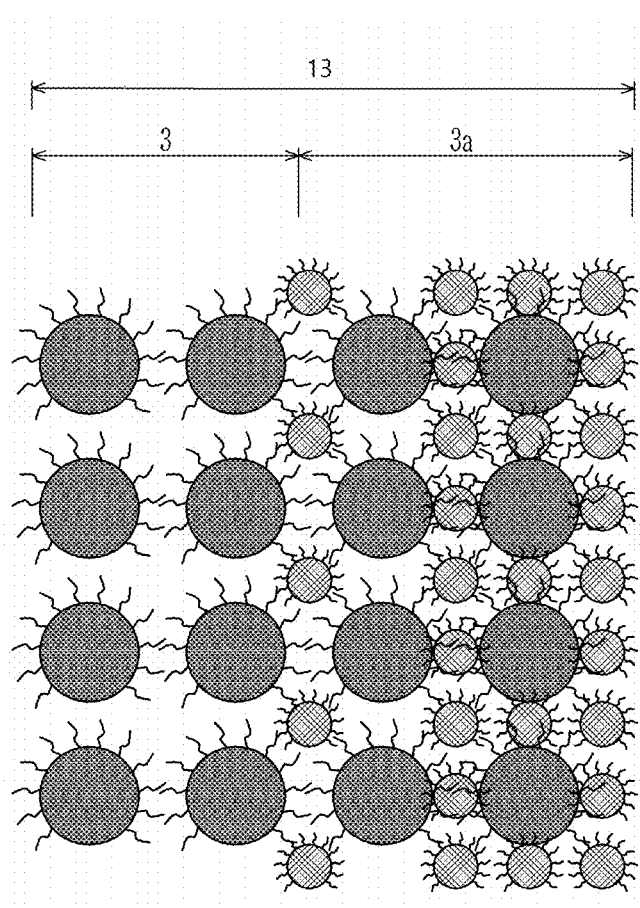
FIG. 4E illustrates a schematic cross-sectional view of an embodiment of a light emitting layer (a quantum dot layer and a first layer) in an electroluminescent device.
Figure 4F:
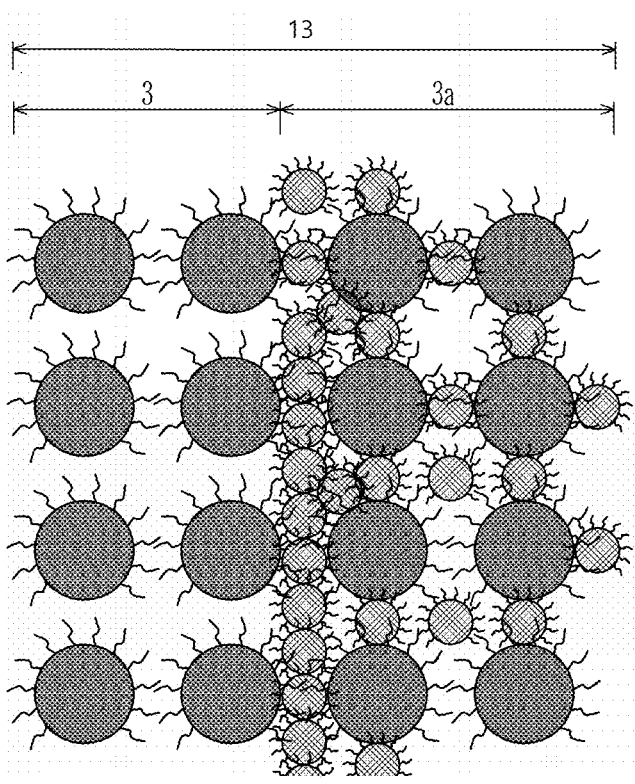
FIG. 4F illustrates a schematic cross-sectional view of an embodiment of a light emitting layer (a quantum dot layer and a first layer) in an electroluminescent device.
Figure 4G:
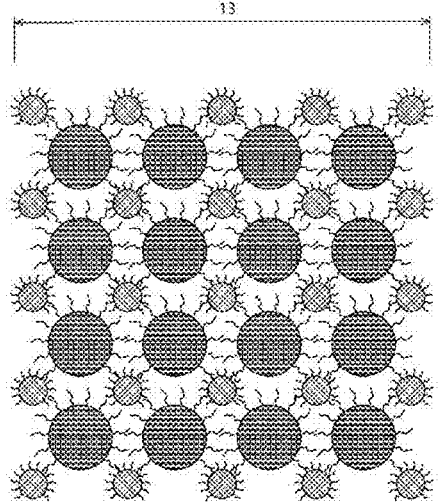
FIG. 4G illustrates a schematic cross-sectional view of a light emitting layer in an electroluminescent device of an embodiment.
Figure 4H:
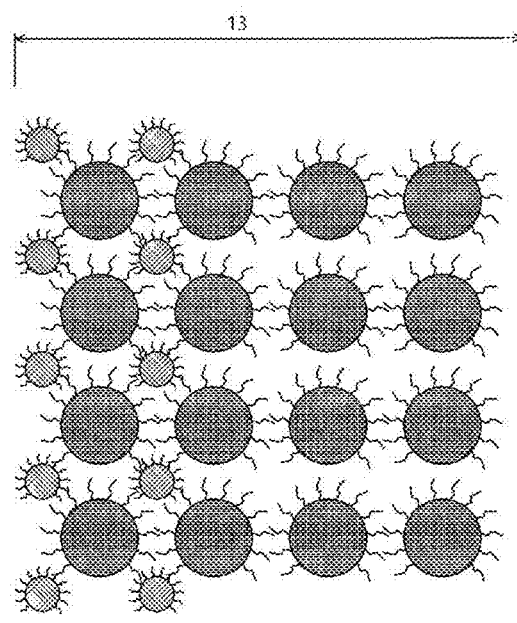
FIG. 4H illustrates a schematic cross-sectional view of a light emitting layer in an electroluminescent device of an embodiment.
Figure 4I:
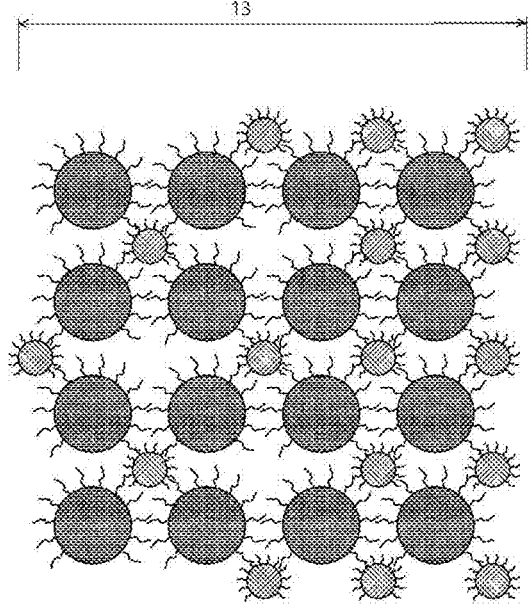
FIG. 4I illustrates a schematic cross-sectional view of an embodiment of a light emitting layer in an electroluminescent device.
Figure 4J:
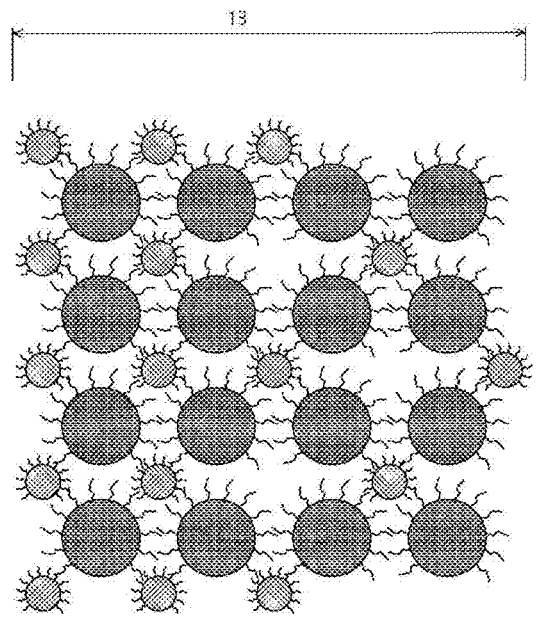
FIG. 4J illustrates a schematic cross-sectional view of an embodiment of a light emitting layer in an electroluminescent device.

Referring to FIG. 4G, the quantum dots and the inorganic nanoparticles may be (for example, relatively uniformly) distributed over a cross section of the light emitting layer 13. Referring to FIG. 4H, as shown in a cross-section of the light emitting layer 13, the inorganic nanoparticles may be dominantly or exclusively distributed in a predetermined portion (e.g., in a portion including a side facing the hole auxiliary layer or in a portion near the hole auxiliary layer) and may not be substantially distributed in the rest portion (e.g., in a portion including a side facing the electron auxiliary layer). Referring to FIG. 4I and FIG. 4J, the inorganic nanoparticles may be distributed with a gradient over a cross-section of the light emitting layer 13 (for example, with a concentration gradient increasing toward the electronic auxiliary layer for FIG. 4I or with a concentration gradient decreasing toward the electron auxiliary layer for FIG. 4J).

The electroluminescent device of an embodiment including the inorganic nanoparticles in the configuration as described herein may exhibit significantly improved light emitting efficiency (e.g., Maximum EQE) in comparison with an electroluminescent device without having the inorganic nanoparticle in the manner described herein.

In an embodiment, as shown in FIG. 4A, 4B, 4C, 4D, 4E, or 4F, the electroluminescent device may have the configuration wherein in the light emitting layer 13, the inorganic nanoparticles are dominantly (or exclusively) distributed in a portion near the electron auxiliary layer and are not substantially distributed in the rest portion (e.g., in a portion including a side facing the hole auxiliary layer) or the configuration wherein the first layer is disposed between the electron transport layer and the quantum dot layer. In a device of an embodiment, the light emitting layer 13 may have a first surface facing the electron transport layer and a second face opposite to the first surface, and in the light emitting layer 13, the inorganic nanoparticles may be distributed more in a portion close to the first surface than in a portion close to the second surface. In such a configuration, the quantum dots may be distributed, for example, relatively uniformly or with a concentration gradient, over a cross section of the light emitting layer 13. The concentration of the quantum dots may increase or decrease toward the electron transport layer. The electroluminescent device of these embodiments may exhibit improved electroluminescent properties (for example, Max EQE and Max luminance) together with an improved lifespan.

In an embodiment, the electroluminescent device may have the configuration of FIG. 4G or FIG. 4H. In a device of an embodiment, the light emitting layer 13 has a first surface facing the electron transport layer and a second face opposite to the first surface, and in the light emitting layer 13, In the light emitting layer 13, the inorganic nanoparticles may be distributed more in a portion close to the second surface than in a portion close to the first surface (see FIG. 4H); or the inorganic nanoparticles may be relatively uniformly distributed over a cross section of the light emitting layer 13 (see FIG. 4G). In such a configuration, the quantum dots may be distributed, for example, relatively uniformly or with a concentration gradient, over a cross section of the light emitting layer 13. The concentration of the quantum dots may increase or decrease toward the electron transport layer. The electroluminescent device having such configuration may exhibit significantly improved light emitting efficiency (e.g., Maximum EQE) and a narrower FWHM in comparison with an electroluminescent device without having the inorganic nanoparticle. The narrower FWHM may contribute to further improving a color reproducibility when the electroluminescent device included in a display device.

The metal chalcogenide included in the inorganic nanoparticle may include zinc, magnesium, calcium, barium, or a combination thereof. The metal chalcogenide may include a magnesium sulfide, a magnesium selenide, a magnesium sulfide selenide, a zinc magnesium selenide, a zinc magnesium sulfide, a zinc sulfide, a zinc selenide sulfide, or a combination thereof. In an embodiment, the first layer, the light emitting layer, the quantum dot layer, or a combination thereof may not include zinc oxide. In an embodiment, the inorganic nanoparticle may include zinc sulfide. In an embodiment, the inorganic nanoparticle may be a zinc sulfide nanoparticle. In an embodiment, the quantum dot may include a zinc selenide, the inorganic nanoparticles may include a metal sulfide, and the metal sulfide may include zinc, magnesium, or a combination thereof.

In an embodiment, a size (e.g., an average size) of the inorganic nanoparticle (or the first peak particle size) may be greater than or equal to about 2 nm, greater than or equal to about 2.5 nm, greater than or equal to about 3 nm, greater than or equal to about 3.5 nm, greater than or equal to about 4 nm, greater than or equal to about 4.5 nm, greater than or equal to about 5 nm, greater than or equal to about 5.5 nm, or greater than or equal to about 6 nm. In an embodiment, a size (e.g., an average size) of the inorganic nanoparticle (or the first peak particle size) may be less than or equal to about 30 nm, less than or equal to about 25 nm, less than or equal to about 20 nm, less than or equal to about 18 nm, less than or equal to about 17 nm, less than or equal to about 15 nm, less than or equal to about 13 nm, less than or equal to about 11 nm, or less than or equal to about 10 nm.

The inorganic nanoparticles may be prepared by an appropriate method or may be commercially available. In an embodiment, the inorganic nanoparticle may be prepared by a chemical wet method wherein a reaction between a precursor containing the aforementioned metal (e.g., metal powder, metal carboxylate, metal acetate, etc.) and a chalcogen precursor (e.g., selenium precursor, tellurium precursor, sulfur precursor, etc.) occurs in an organic solvent and optionally an organic ligand. The reaction temperature and the reaction time may be appropriately selected and are not particularly limited. Details of the organic ligand and the organic solvent and the precursors may refer to what is described in relation to the synthesis of the quantum dot.

The second peak particle size may correspond to or may be related to a size or an average size of the plurality of quantum dots. The first peak particle size may correspond to or may be related to a size or an average size of the inorganic nanoparticles. The first peak particle size may be greater than or equal to about 0.5 nm, greater than or equal to about 1 nm, greater than or equal to about 1.5 nm, greater than or equal to about 2 nm, greater than or equal to about 2.5 nm, greater than or equal to about 3 nm, greater than or equal to about 3.5 nm, greater than or equal to about 4 nm, greater than or equal to about 4.5 nm, greater than or equal to about 5 nm, greater than or equal to about 5.5 nm, greater than or equal to about 6 nm, or greater than or equal to about 6.5 nm. The first peak particle size may be less than or equal to about 14 nm, less than or equal to about 13 nm, less than or equal to about 12 nm, less than or equal to about 11 nm, less than or equal to about 10 nm, less than or equal to about 9 nm, less than or equal to about 8 nm, less than or equal to about 7 nm, less than or equal to about 6 nm, or less than or equal to about 5 nm.

The second peak particle size may represent the size of the quantum dot. In an embodiment, the second peak particle size may be greater than or equal to about 1 nm, greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 10.5 nm, greater than or equal to about 11 nm, greater than or equal to about 11.5 nm, greater than or equal to about 12 nm, greater than or equal to about 12.5 nm, greater than or equal to about 13 nm, greater than or equal to about 13.5 nm, or greater than or equal to about 14 nm; less than or equal to about 50 nm, less than or equal to about 40 nm, less than or equal to about 30 nm, less than or equal to about 25 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 11 nm, less than or equal to about 10 nm, less than or equal to about 9 nm, less than or equal to about 8 nm; or a combination thereof.

In an embodiment, a difference between the first peak particle size and the second peak particle size may be greater than or equal to about 1 nm, greater than or equal to about 2 nm, greater than or equal to about 3 nm, greater than or equal to about 4 nm, greater than or equal to about 4.5 nm, greater than or equal to about 5 nm, greater than or equal to about 5.5 nm, greater than or equal to about 6 nm, greater than or equal to about 6.5 nm, greater than or equal to about 7 nm, greater than or equal to about 7.5 nm, greater than or equal to about 8 nm, greater than or equal to about 8.5 nm, or greater than or equal to about 9 nm. The difference between the first peak particle size and the second peak particle size may be less than or equal to about 20 nm, less than or equal to about 18 nm, less than or equal to about 15 nm, less than or equal to about 12 nm, or less than or equal to about 10 nm.

In an embodiment, a ratio of the number (mode) of the second peak particle sizes to the number (mode) of the first peak particle sizes may be greater than or equal to about 0.1:1. A ratio of the number (mode) of the second peak particle sizes to the number (mode) of the first peak particle sizes may be less than or equal to about 10:1, less than or equal to about 5:1, less than or equal to about 3:1, less than or equal to about 2:1, or less than or equal to about 1:1. In an embodiment, the semiconductor nanoparticle population or the light emitting layer may exhibit a multi-modal or a bimodal distribution wherein two modes are unequal. In an embodiment, the first peak particle size may be a major mode and the second peak particle size may be a minor mode. In an embodiment, the first peak particle size may be a minor mode and the second peak particle size may be a major mode In an embodiment, a ratio of the number (mode) of the second peak particle sizes to the number (mode) of the first peak particle sizes may be less than or equal to about 2:1, less than or equal to about 1.5:1, less than or equal to about 1:1, less than or equal to about 0.9:1, less than or equal to about 0.8:1, less than or equal to about 0.7:1, less than or equal to about 0.6:1, less than or equal to about 0.5:1, less than or equal to about 0.45:1, less than or equal to about 0.4:1, less than or equal to about 0.35:1, or less than or equal to about 0.3:1. The ratio of the number (mode) of the second peak particle sizes to the number (mode) of the first peak particle sizes may be greater than or equal to about 0.05:1, greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, greater than or equal to about 0.4:1, greater than or equal to about 0.5:1, greater than or equal to about 0.6:1, greater than or equal to about 0.7:1, greater than or equal to about 0.8:1, greater than or equal to about 0.9:1, greater than or equal to about 1:1, greater than or equal to about 1.3:1, greater than or equal to about 1.5:1, greater than or equal to about 1.8:1, or greater than or equal to about 2:1.

In an embodiment, the thicknesses of the light emitting layer, the quantum dot layer, and the first layer may be appropriately selected.

In an embodiment, the quantum dot layers 3 and 30 or the light emitting layer 13 including the same may include a monolayer of quantum dots. In an embodiment, the light emitting layer may include one or more, for example, two or more, three or more, or four or more and 20 or less, 10 or less, 9 or less, 8 or less, 7 or less, or 6 or less monolayers of quantum dots.

In the electroluminescent device or the display device of an embodiment, a thickness of the quantum dot layers 3 and 30 or the light emitting layer 13 including the same may be appropriately selected. The quantum dot layers 3 and 30 or the light emitting layer 13 including the same may have a thickness of greater than or equal to about 5 nm, for example, greater than or equal to about 7 nm, greater than or equal to about 9 nm, greater than or equal to about 10 nm, greater than or equal to about 12 nm, greater than or equal to about 15 nm, greater than or equal to about 18 nm, greater than or equal to about 20 nm, greater than or equal to about 25 nm, greater than or equal to about 30 nm, or greater than or equal to about 35 nm, and less than or equal to about 200 nm, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. In an embodiment, the quantum dot layers 3 and 30 or the light emitting layer 13 may have a thickness of, for example, about 10 nm to about 150 nm, about 20 nm to about 100 nm, or about 30 nm to about 50 nm. In an embodiment, the quantum dot layers 3 and 30 or the light emitting layer 13 including the same may have a thickness of greater than or equal to 5 nm, or greater than or equal to 7 nm. The quantum dot layer or the light emitting layer may have a thickness of less than or equal to 80 nm, or less than or equal to 50 nm.

A thickness of the first layer may be greater than or equal to about 1 nm, greater than or equal to about 1.5 nm, greater than or equal to about 2 nm, greater than or equal to about 3 nm, greater than or equal to about 4 nm, greater than or equal to about 5 nm, greater than or equal to about 7 nm, greater than or equal to about 9 nm, greater than or equal to about 11 nm, greater than or equal to about 13 nm, or greater than or equal to about 15 nm. A thickness of the first layer may be less than or equal to about 70 nm, less than or equal to about 60 nm, less than or equal to about 50 nm, less than or equal to about 40 nm, less than or equal to about 35 nm, less than or equal to about 30 nm, less than or equal to about 25 nm, less than or equal to about 20 nm, or less than or equal to about 15 nm.

In an embodiment, the formation of the light emitting layer 13 (or the quantum dot layers 3 and 30 and the first layers 3a and 30a) may involve a solution process.

The solution process may include dispersing a corresponding particle (a quantum dot, an inorganic nanoparticle, or a combination thereof) in a solvent and applying them to form a layer.

In an embodiment, the formation of the quantum dot layer 3 and 30 may be carried out by obtaining a liquid composition (an ink or coating solution, or a dispersion) containing a quantum dot and an organic solvent (e.g., an alkane solvent such as octane, heptane, or a combination thereof) and depositing the composition on a substrate (e.g., an electrode or a charge auxiliary layer such as a hole auxiliary layer) for example, via a spin coating, an inkjet printing).

In an embodiment, the formation of the first layer may be carried out by dispersing an inorganic nanoparticle and optionally a quantum dot in an appropriate solvent to obtain a dispersion and applying or depositing the dispersion on or over the substrate or the quantum dot layer.

After the application and the deposition, a washing, a thermal treatment, or a combination thereof may be conducted, if desired.

A type of the organic solvent for the dispersion or the compositions is not particularly limited, and may be appropriately selected taking into consideration of a subject matter (e.g., a particle) to be dispersed and a subject matter (e.g., a substrate or a quantum dot layer) to be applied/deposited. In an embodiment, the organic solvent may include a (substituted or unsubstituted) aliphatic hydrocarbon organic solvent (e.g., a C3 to C30 alkane solvent such as octane), a (substituted or unsubstituted) aromatic hydrocarbon organic solvent (e.g., a benzene solvent with or without an alicyclic moiety), an acetate solvent, an alcohol solvent, or a combination thereof.

In an embodiment, the formation of the quantum dot layer or the light emitting layer may further include contacting the film of the semiconductor nanoparticles with a metal halide (e.g., a zinc chloride)-containing organic solution (e.g., including an alcohol solvent). In an embodiment, the quantum dot layer or the light emitting layer may include a first quantum dot layer and a second quantum dot layer, wherein the first quantum dot layer includes a quantum dot with a halogen (e.g., chlorine) exchanged surface and the second quantum dot layer has an increased amount of an organic ligand. A halogen (e.g., chlorine) amount and an organic ligand amount of the quantum dot layer may be controlled with an appropriate manner (e.g., a post treatment for the formed layer). In an embodiment, a thin film of the semiconductor nanoparticles having an organic ligand (e.g., having a carboxylic acid group) is formed, which is then treated with a solution including a metal halide (e.g., a zinc halide such as a zinc chloride in alcohol solvent) to control an amount of the organic ligand of the semiconductor nanoparticles in the thin film. The treated thin film may have an increased halogen amount, showing, e.g., exhibiting, a changed property (e.g., solubility) to, e.g., relative to, an organic solvent, and it may be possible to form a layer of semiconductor nanoparticles having a different amount of an organic ligand (e.g., a halogen treated semiconductor nanoparticle or a semiconductor nanoparticle with a ligand having a carboxylic acid group) on the treated thin film, subsequently.

In an embodiment, the quantum dot layer or the light emitting layer may be a single layer or a multi-layered structure having at least two layers. In a multi-layered structure, adjacent layers (e.g., a first quantum dot layer and a second quantum dot layer) may be configured to emit a first light (e.g., green light, blue light, or red light). In a multi-layered structure, adjacent layers (e.g., a first quantum dot layer and a second quantum dot layer) may have the same or different composition, ligands, or a combination thereof. In an embodiment, the (multi-layered) light emitting layer may exhibit a halogen content that varies (increase or decrease) in a thickness direction. In an embodiment, in the (multi-layered) light emitting layer, the amount of the halogen may increase in a direction toward the electron auxiliary layer. In the (multi-layered) light emitting layer, the amount of the organic ligand may decrease in a direction toward the electron auxiliary layer. In the (multi-layered) light emitting (e.g., quantum dot) layer, the content of the organic ligand may increase in a direction toward the electron auxiliary layer.

In an embodiment, the light emitting layer, the quantum dot layer, or the first layer thus formed (or optionally further treated with the halogen solution) may be washed with a washing solvent (e.g., water or an organic solvent miscible with the water). A manner of the washing is not particularly limited and may be conducted by a spin and dry (wherein a washing solvent is placed on a layer to be washed and the layer is spun and dried to remove a washing solvent placed on the layer), a dipping, or a combination thereof. In an embodiment, the washing may be omitted.

In an embodiment, the light emitting layer, the quantum dot layer, or the first layer may be heat-treated. The heat treating may be carried out in air or in an inert gas atmosphere. A temperature of the heat treating may be greater than or equal to about 50° C., greater than or equal to about 70° C., greater than or equal to about 90° C., greater than or equal to about 100° C., greater than or equal to about 120° C., greater than or equal to about 150° C., greater than or equal to about 170° C., or greater than or equal to about 200° C. A temperature of the heat treating may be less than or equal to about 250° C., less than or equal to about 230° C., less than or equal to about 200° C., less than or equal to about 180° C., less than or equal to about 160° C., less than or equal to about 140° C., or less than or equal to about 130° C.

In an embodiment, the first layer may include or may not include a quantum dot (e.g., a second quantum dot). In an embodiment, the first layer further include a quantum dot, and the volume ratio between the quantum dots and the inorganic nanoparticles in the first layer or in the dispersion (i.e., the volume of quantum dots: the volume of the inorganic nanoparticles) may be 1: greater than or equal to about 0.05, 1: greater than or equal to about 0.1, 1: greater than or equal to about 0.2, 1: greater than or equal to about 0.3, 1: greater than or equal to about 0.4, 1: greater than or equal to about 0.5, 1: greater than or equal to about 0.6, 1: greater than or equal to about 0.7, 1: greater than or equal to about 0.8, 1: greater than or equal to about 0.9, 1: greater than or equal to about 1, 1: greater than or equal to about 1.2, 1: greater than or equal to about 1.4, 1: greater than or equal to about 1.6, 1: greater than or equal to about 1.8, 1: greater than or equal to about 2, or 1: greater than or equal to about 2.5. The volume ratio between the quantum dot and the inorganic nanoparticle (quantum dot:inorganic nanoparticle) may be 1: less than or equal to about 20, 1: less than or equal to about 15, 1: less than or equal to about 10, 1: less than or equal to about 9, 1: less than or equal to about 8, 1: less than or equal to about 7.5, 1: less than or equal to about 7, 1: less than or equal to about 6.5, 1: less than or equal to about 6, 1: less than or equal to about 5.5, 1: less than or equal to about 5, 1: less than or equal to about 4.5, 1: less than or equal to about 4, 1: less than or equal to about 3.5, 1: less than or equal to about 3, 1: less than or equal to about 2.8, 1: less than or equal to about 2.4, or 1: less than or equal to about 2.1.

In an embodiment, the first layer may exhibit a photoluminescence property or an electroluminescence property that is different from the quantum dot layer. Without wishing to be bound by any theory, it is believed that the first layer may contribute to the improvement of the electroluminescent properties and the lifespan of the electroluminescent device including the same.

In an embodiment, the first layer may exhibit an increased luminance intensity as, e.g., after, being exposed to a high-power (e.g., of greater than or equal to about 18 milliwatts (mW), for example, 25 mW or 22.4 mW) laser emitting light of a predetermined wavelength for 60 seconds (i.e., 1 minute). In an embodiment, based on an initial luminance intensity (i.e., the initial luminance intensity is to be 100%), the first layer may have a luminance intensity maintenance percentage (e.g., a relative luminance intensity) of greater than or equal to about 100%, greater than or equal to about 101%, greater than or equal to about 102%, greater than or equal to about 103%, greater than or equal to about 104%, greater than or equal to about 105%, greater than or equal to about 106%, greater than or equal to about 107%, greater than or equal to about 108%, or greater than or equal to about 109%. The luminance intensity maintenance percentage of the first layer may be less than or equal to about 120%, less than or equal to about 119%, less than or equal to about 118%, less than or equal to about 117%, less than or equal to about 116%, less than or equal to about 115%, less than or equal to about 113%, less than or equal to about 112%, or less than or equal to about 110.5%.

In an embodiment, as the first layer is exposed to a high-power laser emitting a certain wavelength of light (e.g., about 18 mW or about 22.4 mW) for one minute, a variance of the luminance intensity (i.e., a difference between a maximum relative luminance intensity and a relative luminance intensity at 60 seconds, based on the initial luminance intensity of 100%) may be less than or equal to about 10%, less than or equal to about 8%, less than or equal to about 7%, or less than or equal to about 5% and greater than or equal to about 1%, greater than or equal to about 2%, or greater than or equal to about 3%.

In an embodiment, the first layer may further include the same quantum dot as in the quantum dot layer, and the photoluminescence spectrum of the first layer may represent a blue shifted peak emission wavelength (i.e., a reduced peak emission wavelength) and a reduced FWHM as compared to the quantum dot layer. This blue shift and the reduced FWHM may indicate a decrease in an energy movement or transition (e.g., Forster Resonance Energy Transfer ("FRET")) between quantum dots. The blue shift (or a reduction of the peak emission wavelength) of the photoluminescent spectrum of the first layer may be greater than or equal to about 0.5 nm, greater than or equal to about 1 nm, greater than or equal to about 1.5 nm, greater than or equal to about 2 nm, greater than or equal to about 2.5 nm, greater than or equal to about 3 nm, or greater than or equal to about 3.5 nm. The blue shift (a reduction of the peak emission wavelength) of the photoluminescent spectrum of the first layer may be less than or equal to about 10 nm, less than or equal to about 9 nm, less than or equal to about 8 nm, less than or equal to about 7 nm, less than or equal to about 6 nm, less than or equal to about 5 nm, less than or equal to about 4 nm, less than or equal to about 3.4 nm, or less than or equal to about 2.8 nm.

In an embodiment, the first layer may further include the same quantum dot as in the quantum dot layer, the photoluminescence spectrum of the first layer may exhibit a reduced FWHM compared to the quantum dot layer. The reduction in the FWHM may be less than or equal to about 10 nm, or less than or equal to about 8 nm and greater than or equal to about 1 nm, or greater than or equal to about 3 nm.

The present inventors have, surprisingly, found that the first layer or the light emitting layer may contribute to reducing a hysteresis of the electroluminescent device. Without wishing to be bound by any theory, the first layer or the light emitting layer may have a reduced electron mobility compared to the quantum dot layer, resulting in an increase in resistance, but may show, e.g., exhibit, very surprisingly reduced hysteresis, and accordingly, the current may be maintained after a current-voltage ("JV") sweep at a predetermined voltage range (e.g., from 0 volt to 8 volts) is repeated three times.

In an embodiment, as a JV graph is obtained by applying a voltage of 0 volts to 8 volts to a stacked structure of an anode/the electron transport layer/the first layer or the light emitting layer/the electron transport layer/a cathode, the first layer or the light emitting layer may have (exhibit) a current density at 3 volts during a first (initial) sweep that is greater than or equal to about 25 mA/cm$^2$, greater than or equal to about 30 mA/cm$^2$, greater than or equal to about 35 mA/cm$^2$, greater than or equal to about 40 mA/cm$^2$, greater than or equal to about 45 mA/cm$^2$, greater than or equal to about 50 mA/cm$^2$, greater than or equal to about 55 mA/cm$^2$, greater than or equal to about 60 mA/cm$^2$, greater than or equal to about 65 mA/cm$^2$, greater than or equal to about 70 mA/cm$^2$, greater than or equal to about 75 mA/cm$^2$, greater than or equal to about 80 mA/cm$^2$, greater than or equal to about 85 mA/cm$^2$, greater than or equal to about 90 mA/cm$^2$, or greater than or equal to about 95 mA/cm$^2$ and less than or equal to about 158 mA/cm$^2$, less than or equal to about 150 mA/cm$^2$, less than or equal to about 140 mA/cm$^2$, less than or equal to about 130 mA/cm$^2$, less than or equal to about 120 mA/cm$^2$, less than or equal to about 110 mA/cm$^2$, or less than or equal to about 100 mA/cm$^2$.

In an embodiment, as a JV graph is obtained by applying a voltage of 0 volts to 8 volts to a stacked structure of an anode/the electron transport layer/the first layer or the light emitting layer/the electron transport layer/a cathode, the first layer or the light emitting layer may have a maximum current density appearing during a third sweep that is greater than or equal to about 106 mA/cm$^2$, greater than or equal to about 108 mA/cm$^2$, greater than or equal to about 110 mA/cm$^2$, greater than or equal to about 120 mA/cm$^2$, greater than or equal to about 140 mA/cm$^2$, greater than or equal to about 160 mA/cm$^2$, greater than or equal to about 180 mA/cm$^2$, greater than or equal to about 200 mA/cm$^2$, or greater than or equal to about 215 mA/cm$^2$. In an embodiment, as a JV graph is obtained by applying a voltage of 0 volts to 8 volts to a stacked structure of an anode/the electron transport layer/the first layer or the light emitting layer/the electron transport layer/a cathode, the first layer or the light emitting layer may have a maximum current density appearing during a third sweep that is less than or equal to ab out 400 mA/cm$^2$, less than or equal to about 350 mA/cm$^2$, less than or equal to about 320 mA/cm$^2$, less than or equal to about 290 mA/cm$^2$, less than or equal to about 280 mA/cm$^2$, less than or equal to about 250 mA/cm$^2$, or less than or equal to about 240 mA/cm 2.

Without wishing to be bound by any theory, it is believed that the first layer may provide a reduced hole transport due to the deep valence band of inorganic nanoparticles (e.g., ZnS), and thus, in an embodiment, the structure described herein may control or reduce hole leakage to the electron auxiliary layer (e.g., electron transport layer).

In an embodiment, as a voltage of 8 volts is applied to a stacked structure of an anode/a hole auxiliary layer including a PEDOT (e.g., PEDOT:polystyrene sulfonate ("PSS")/poly(9,9-dioctyl-fluorene-co-N-(4)-butylphenyh-diphe-nylamine) ("TFB"))/the first layer or the light emitting layer/a hole auxiliary layer including an organic compound such as TCTA/a cathode, the first layer or the light emitting layer may exhibit a current density of greater than or equal to about 0.1 mA/cm$^2$, greater than or equal to about 1 mA/cm$^2$, greater than or equal to about 5 mA/cm$^2$, greater than or equal to about 10 mA/cm$^2$, greater than or equal to about 15 mA/cm$^2$, greater than or equal to about 18 mA/cm$^2$, or greater than or equal to about 20 mA/cm$^2$. As a voltage of 8 volts) is applied to a stacked structure of an anode/a hole auxiliary layer including a PEDOT (e.g., PEDOT:PSS/

TFB)/the first layer or the light emitting layer/a hole auxiliary layer including an organic compound/a cathode, the first layer or the light emitting layer may exhibit a current density of less than or equal to about 125 mA/cm$^2$, less than or equal to about 50 mA/cm$^2$, less than or equal to about 30 mA/cm$^2$.

In an embodiment, the light emitting layer may have a mole ratio of sulfur to selenium that is greater than or equal to about 0.1:1, greater than or equal to about 0.2:1, greater than or equal to about 0.3:1, greater than or equal to about 0.4:1, greater than or equal to about 0.5:1, greater than or equal to about 0.6:1, greater than or equal to about 0.7:1, greater than or equal to about 0.8:1, greater than or equal to about 0.9:1, greater than or equal to about 1:1, greater than or equal to about 1.1:1, or greater than or equal to about 1.2:1. In an embodiment, the light emitting layer may have a mole ratio of sulfur to selenium that is less than or equal to about 5.0:1, less than or equal to about 4.5:1, less than or equal to about 4.0:1, less than or equal to about 3:1, less than or equal to about 2.5:1, less than or equal to about 2.0:1, less than or equal to about 1.9:1, less than or equal to about 1.7:1, less than or equal to about 1.5:1, less than or equal to about 1.3:1, less than or equal to about 1.1:1, less than or equal to about 0.9:1, less than or equal to about 0.7:1, or less than or equal to about 0.5:1. In an embodiment, the light emitting layer may have a mole ratio of sulfur to selenium that is in a range of from about 2:1 to about 5:1, from about 2.5:1 to about 4.5:1, from about 3:1 to about 4:1, or a combination thereof.

An electroluminescent device of an embodiment includes a zinc oxide nanoparticle-based electron transport layer disposed on the light emitting layer (or on the quantum dot layer, or the first layer, or on the quantum dot layer and the first layer), for example, between the second electrode and the light emitting layer or the quantum dot layer. The electron transport layer includes a plurality of zinc oxide nanoparticles. The electroluminescent device of an embodiment may include an electron auxiliary layer including the electron transport layer. In an embodiment, an electron injection layer may be disposed between the second electrode and the electron transport layer, but is not limited thereto. The electron transport layer may be disposed adjacent to the light emitting layer or the first layer (e.g., directly above the light emitting layer or the first layer). In an embodiment, the electron transport layer may contact the light emitting layer or the first layer.

The zinc oxide (nanoparticle) may include zinc; and optionally a Group IIA metal, Zr, W, Li, Ti, Y, Al, gallium, indium, tin (Sn), cobalt (Co), vanadium (V), or a combination thereof. The zinc oxide (nanoparticle) may further include a Group IIA metal such as magnesium, and optionally an alkali metal.

The zinc oxide (nanoparticle) may include a compound represented by $Zn_{1-x}M_xO$, wherein, M is Mg, Ca, Zr, Co, W, Li, Ti, Y, Al, or a combination thereof, and $0 \leq x \leq 0.5$. The x may be greater than or equal to about 0.01, greater than or equal to about 0.03, greater than or equal to about 0.05, greater than or equal to about 0.07, greater than or equal to about 0.1, greater than or equal to about 0.13, greater than or equal to about 0.15, greater than or equal to about 0.17, greater than or equal to about 0.2, greater than or equal to about 0.23, or greater than or equal to about 0.25. The x may be less than or equal to about 0.47, less than or equal to about 0.45, less than or equal to about 0.43, less than or equal to about 0.4, less than or equal to about 0.37, less than or equal to about 0.35, or less than or equal to about 0.3. The zinc oxide (nanoparticle) may further include magnesium. The electron transport layer or the zinc oxide may include $Zn_{1-x}Mg_xO$ (x is greater than or equal to 0, or greater than 0 and less than or equal to about 0.5, the x is the same as defined herein), ZnO, or a combination thereof.

A size or an average size of the zinc oxide nanoparticle may be greater than or equal to about 1 nm, greater than or equal to about 2 nm, greater than or equal to about 2.5 nm, greater than or equal to about 3 nm, or greater than or equal to about 3.5 nm and less than or equal to about 10 nm, less than or equal to about 9 nm, less than or equal to about 8 nm, less than or equal to about 7 nm, less than or equal to about 6 nm, less than or equal to about 5 nm, or less than or equal to about 4.5 nm.

In an embodiment, the zinc oxide nanoparticle may be prepared in any proper method, which is not particularly limited. The preparation of the zinc oxide nanoparticles may include a sol-gel reaction. In an embodiment, the zinc oxide (e.g., zinc magnesium oxide) nanoparticle may be prepared by placing a zinc compound (e.g., an organic zinc compound such as zinc acetate dihydrate) and optionally an additional metal compound (e.g., an additional organic metal compound such as magnesium acetate tetrahydrate) in an organic solvent (e.g., dimethylsulfoxide) in a flask to have a desired mole ratio and heating the same at a predetermined temperature (e.g., from about 40° C. to about 120° C., or from about 60° C. to about 100° C.) (e.g., in air), and adding a precipitation accelerator solution (for example, a solution of tetramethyl ammonium hydroxide pentahydrate and ethanol) at a predetermined rate with, e.g., while, stirring. The prepared zinc oxide nanoparticle (e.g., $Zn_{1-x}Mg_xO$ nanoparticle) may be recovered from a reaction solution for example via centrifugation.

In the aforementioned electron transport layer, the zinc oxide nanoparticle may provide a higher electron mobility than organic semiconductor materials, and the quantum dot layer, for example, may exhibit a desired level of electroluminescence properties in combination with the zinc oxide nanoparticle-based electron transport layer. In addition, a quantum dot layer based on semiconductor nanoparticles can be formed by a solution process, and an electron transport layer based on zinc oxide nanoparticles can be formed on the quantum dot layer by a solution process, which can be advantageous in the process.

In an embodiment, the electron auxiliary layer or the electron transport layer may be prepared in a solution process. In an embodiment, the electron auxiliary layer or the electron transport layer may be prepared by dispersing a plurality of metal oxide nanoparticles in an organic solvent (for example, a polar solvent, a non-polar solvent, or a combination thereof) to obtain an electron transport layer precursor dispersion, which is then applied to a surface to form a film. The electron transport layer precursor dispersion may be applied to the light emitting layer or the first layer. The solution process may further include removing the organic solvent from the formed film for example by evaporation. The organic solvent may include a C1 to C10 alcohol solvent or a combination thereof.

In an embodiment, the electron auxiliary layer 4 or 40 may further include an electron injection layer, a hole blocking layer, or a combination thereof. An electron injection layer, a hole blocking layer, or a combination thereof may be disposed between the electron transport layer and the second electrode. In an embodiment, a hole blocking layer may be disposed between the electron injection layer and the electron transport layer. The thickness of the electron injection layer, the hole blocking layer, or a combination thereof is not particularly limited and may be appropriately selected.

In an embodiment, a material for the electron injection layer, the hole blocking layer, or a combination thereof may include 1,4,5,8-naphthalene-tetracarboxylic dianhydride ("NTCDA"), bathocuproine ("BCP"), tris[3-(3-pyridyl)-mesityl]borane ("3TPYMB"), LiF, tris(8-hydroxyquinolinato) aluminum ("$Alq_3$"), tris(8-hydroxyquinolinato)gallium ("$Gaq_3$"), tris(8-hydroxyquinolinato)indium ("$Inq_3$"), bis-(8-hydroxyquinolinato)zinc ("$Znq_2$"), bis[2-(2-hydroxyphenyl)benzothiazolato]zinc ("$Zn(BTZ)_2$"), bis(10-hydroxybenzo[H]quinolinato)beryllium ("$BeBq_2$"), 8-(4-(4,6-di (naphthalen-2-yl)-1,3,5-triazin-2-yl)phenyl)quinolone ("ET204"), 8-hydroxyquinolinato lithium ("Liq"), 2,2',2"-(1,3,5-Benzenetriyl)-tris(1-phenyl-1-H-benzimidazole) ("TPBi"), an n-type metal oxide (e.g., ZnO, $HfO_2$, etc.), 8-(4-(4,6-di(naphthalen-2-yl)-1,3,5-triazin-2-yl)phenyhquinolone:8-hydroxyquinolinato lithium ("ET204:Liq"), or a combination thereof, but is not limited thereto.

The thickness of the electron transport layer, the electron injection layer, the hole blocking layer, or a combination thereof is not particularly limited and may be appropriately selected. A thickness of the electron transport layer, the electron injection layer, the hole blocking layer, or a combination thereof may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, greater than or equal to about 20 nm, or greater than or equal to about 21 nm and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

In an embodiment, the electroluminescent device may further include a hole auxiliary layer 12, 20 between the first electrode 11, 10 and the light emitting layer 13, 30. The hole auxiliary layer 12, 20 may include a hole injection layer, a hole transport layer, an electron blocking layer, or a combination thereof. The hole auxiliary layer 12, 20 may be a single layer or a multilayer structure in which adjacent layers include different components.

The hole auxiliary layer 12, 20 may have a HOMO energy level that can be matched with the HOMO energy level of the light emitting layer 13 or the quantum dot layer 30 in order to enhance mobility of holes transferred from the hole auxiliary layer 12, 20 to the light emitting layer 13 or the quantum dot layer 30. In an embodiment, the hole auxiliary layer 12, 20 may include a hole injection layer close to, e.g., adjacent, the first electrode 11, 10 and a hole transport layer close to, e.g., adjacent, the light emitting layer 13 or the quantum dot layer 30.

In an embodiment, the material included in the hole auxiliary layer 20 (e.g., a hole transport layer, a hole injection layer, or an electron blocking layer) is not particularly limited, and may include, for example, poly(9,9-dioctyl-fluorene-co-N-(4)-butylphenyl)-diphenylamine) ("TFB"), polyarylamine, poly(N-vinylcarbazole), poly(3,4-ethylenedioxythiophene) ("PEDOT"), poly(3,4-ethylenedioxythiophene):polystyrene sulfonate ("PEDOT:PSS"), polyaniline, polypyrrole, N,N,N',N'-tetrakis(4-methoxyphenyl)-benzidine ("TPD"), 4,4'-bis[N-(1-naphthyl)-N-phenyl-amino]biphenyl ("α-NPD"), m-MTDATA (4,4',4"-Tris[phe-nyl(m-tolyl)amino]triphenylamine), 4,4',4"-tris(N-carbazolyl)-triphenylamine ("TCTA"), 1,1-bis[(di-4-toylamino)phenyl]cyclohexane ("TAPC"), a p-type metal oxide (e.g., NiO, $WO_3$, $MoO_3$, etc.), a carbon-based material such as graphene oxide, or a combination thereof, but is not limited thereto.

In the hole auxiliary layer, the thickness of each layer may be appropriately selected. For example, the thickness of each layer may be greater than or equal to about 5 nm, greater than or equal to about 10 nm, greater than or equal to about 15 nm, or greater than or equal to about 20 nm and less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 35 nm, or less than or equal to about 30 nm, but is not limited thereto.

In the device of an embodiment, the anode 10 may be disposed on the transparent substrate 100 and may include a metal oxide-based transparent electrode (e.g., an ITO electrode), and the cathode 50 facing the anode 10 may include a conductive metal (e.g., having a relatively low work function, Mg, Al, etc.). The hole auxiliary layer 20 (e.g., a hole injection layer such as PEDOT:PSS, p-type metal oxide, or a combination thereof; a hole transport layer such as TFB, polyvinylcarbazole ("PVK"), or a combination thereof; or a combination thereof) may be provided between the anode (e.g., a transparent electrode) 10 and the quantum dot layer 30. The hole injection layer may be disposed close to, e.g., adjacent, the anode and the hole transport layer may be disposed close to, e.g., adjacent, the light emitting layer. The electron transport layer or the electron auxiliary layer including the same (such as an electron injection/transport layer) 40 may be disposed between the quantum dot layer 30 (or the first layer 30a) and the cathode 50.

Figure 2B:
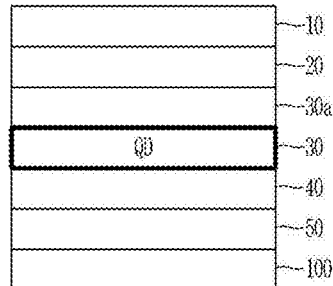
FIG. 2B is a schematic cross-sectional view of an embodiment of an electroluminescent device.
Figure 2C:
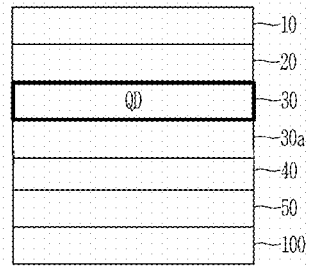
FIG. 2C is a schematic cross-sectional view of an embodiment of an electroluminescent device.

In the device of an embodiment, the cathode 50 may be disposed on the transparent substrate 100 and may include a metal oxide-based transparent electrode (e.g., an ITO electrode), and the anode 10 facing the cathode 50 may include a conductive metal (e.g., having a relatively low work function, Mg, Al, etc.). as shown in FIG. 2B and FIG. 2C.

In an embodiment, the electroluminescent device of an embodiment may be manufactured by a method, which includes:

forming the light emitting layer (or the quantum dot layer and the first layer) on or over a first electrode, forming an electron transport layer on the light emitting layer (or the quantum dot layer and/or the first layer), and forming a second electrode on or over the electron transport layer.

In an embodiment, the method may further include forming a hole auxiliary layer on the first electrode (for example, disposed on a substrate), for example via a physical deposition (e.g., a vapor deposition) or a coating process. The method may further include forming an electron injection layer, a hole blocking layer, or a combination thereof on or over the electron transport layer. The forming of the light emitting layer (or the quantum dot layer and/or the first layer) is the same as described herein.

A manner to form the second electrode is not particularly limited and an appropriate one such as a physical deposition or a coating may be selected taking into account a type of an electrode material.

The electroluminescent device of an embodiment may exhibit both improved electroluminescent properties, for example, and a longer lifespan as described herein. The light emitting device of an embodiment may be configured to emit red light, green light, or blue light.

In an embodiment, the electroluminescent device may have a maximum external quantum efficiency ("EQE") of greater than or equal to about 5%, greater than or equal to about 5.5%, greater than or equal to about 6%, greater than or equal to about 6.5%, greater than or equal to about 7%, greater than or equal to about 7.5%, greater than or equal to about 7.7%, greater than or equal to about 8%, greater than or equal to about 8.5%, greater than or equal to about 9%, greater than or equal to about 9.5%, greater than or equal to about 10%, greater than or equal to about 10.5%, greater than or equal to about 11%, greater than or equal to about 11.5%, greater than or equal to about 12%, greater than or equal to about 12.5%, greater than or equal to about 13%, greater than or equal to about 13.5%, or greater than or equal to about 14%. The maximum external quantum efficiency ("EQE") may be less than or equal to about 60%, less than or equal to about 50%, less than or equal to about 40%, less than or equal to about 30%, or less than or equal to about 20%.

The electroluminescent device of an embodiment may exhibit a maximum luminance of greater than or equal to about 10,000 candela per square meter (cd/m 2), greater than or equal to about 30,000 $cd/m^2$, greater than or equal to about 40,000 $cd/m^2$, greater than or equal to about 60,000 $cd/m^2$, greater than or equal to about 65,000 $cd/m^2$, greater than or equal to about 70,000 $cd/m^2$, greater than or equal to about 80,000 $cd/m^2$, greater than or equal to about 90,000 $cd/m^2$, greater than or equal to about 100,000 $cd/m^2$, greater than or equal to about 110,000 $cd/m^2$, greater than or equal to about 120,000 $cd/m^2$, greater than or equal to about 130,000 $cd/m^2$, greater than or equal to about 140,000 $cd/m^2$, greater than or equal to about 150,000 $cd/m^2$, greater than or equal to about 160,000 $cd/m^2$, greater than or equal to about 170,000 $cd/m^2$, greater than or equal to about 180,000 $cd/m^2$, greater than or equal to about 190,000 $cd/m^2$, greater than or equal to about 200,000 $cd/m^2$, greater than or equal to about 210,000 $cd/m^2$, greater than or equal to about 220,000 $cd/m^2$, greater than or equal to about 230,000 $cd/m^2$, greater than or equal to about 240,000 $cd/m^2$, greater than or equal to about 250,000 $cd/m^2$, greater than or equal to about 300,000 $cd/m^2$, greater than or equal to about 400,000 $cd/m^2$, greater than or equal to about 500,000 $cd/m^2$, greater than or equal to about 600,000 $cd/m^2$, greater than or equal to about 700,000 $cd/m^2$, greater than or equal to about 800,000 $cd/m^2$, greater than or equal to about 900,000 $cd/m^2$, or greater than or equal to about 1,000,000 $cd/m^2$. The maximum luminance may be less than or equal to about 2,000,000 $cd/m^2$, less than or equal to about 1,500,000 $cd/m^2$, or less than or equal to about 1,000,000 $cd/m^2$.

In an embodiment, as measured by driving the device at a predetermined initial luminance (for example, about 650 nit), the electroluminescent device may exhibit a T50 of greater than or equal to about 20 hours, greater than or equal to about 25 hours, greater than or equal to about 30 hours, greater than or equal to about 40 hours, greater than or equal to about 50 hours, greater than or equal to about 60 hours, greater than or equal to about 65 hours, greater than or equal to about 70 hours, greater than or equal to about 80 hours, greater than or equal to about 90 hours, greater than or equal to about 100 hours, greater than or equal to about 120 hours, greater than or equal to about 150 hours, greater than or equal to about 180 hours, greater than or equal to about 200 hours, or greater than or equal to about 250 hours. The T50 may be from about 25 hours to about 1,000 hours, about 130 hours to about 500 hours, from about 190 hours to about 300 hours, or a combination thereof.

In an embodiment, as measured by driving the device at a predetermined initial luminance (for example, about 650 nit), the electroluminescent device may have a T90 of greater than or equal to about 5 hours, e.g., a T90 of greater than or equal to about 6 hours, greater than or equal to about 7 hours, greater than or equal to about 7.5 hours, greater than or equal to about 8 hours, greater than or equal to about 9 hours, greater than or equal to about 10 hours, greater than or equal to about 20 hours, greater than or equal to about 30 hours, greater than or equal to about 40 hours, greater than or equal to about 50 hours, greater than or equal to about 60 hours, greater than or equal to about 70 hours, greater than or equal to about 80 hours, greater than or equal to about 90 hours, greater than or equal to about 100 hours, greater than or equal to about 110 hours, greater than or equal to about 120 hours, or greater than or equal to about 130 hours. The T90 may be from about 35 hours to about 1,500 hours, from about 55 hours to about 1,200 hours, from about 85 hours to about 1,000 hours, from about 105 hours to about 900 hours, from about 115 hours to about 800 hours, from about 145 hours to about 500 hours, or a combination thereof.

As the applied voltage is changed from 2 volts to 6 volts, the electroluminescent device of an embodiment or the light emitting layer 13 included therein may exhibit a blue-shift (e.g., a decrease) in a peak emission wavelength of the first light (e.g., blue light) by greater than or equal to about 1 nm, greater than or equal to about 5 nm, greater than or equal to about 7 nm, greater than or equal to about 8 nm, greater than or equal to about 9 nm and less than or equal to about 15 nm, less than or equal to about 12 nm, less than or equal to about 10 nm, or less than or equal to about 9 nm.

As the applied voltage is changed from 2 volts to 6 volts, the electroluminescent device of an embodiment or the light emitting layer 13 included therein may exhibit a decrease in a full width at half maximum of the first light (e.g., blue light) by greater than or equal to about 1 nm, greater than or equal to about 5 nm, greater than or equal to about 7 nm, greater than or equal to about 8 nm, or greater than or equal to about 9 nm and less than or equal to about 20 nm, less than or equal to about 15 nm, less than or equal to about 10 nm, or less than or equal to about 9 nm.

In an embodiment, a display device includes the electroluminescent device described herein.

The display device may include a first pixel and a second pixel that is configured to emit light different from the light of the first pixel.

Figure 5A:
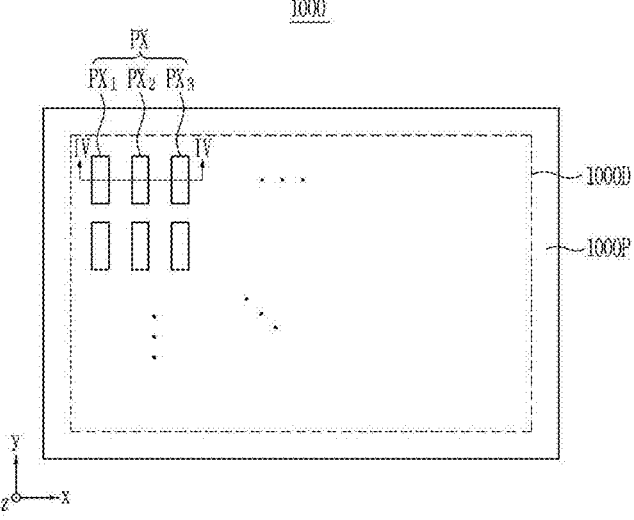
FIG. 5A is a schematic plan view illustrating an embodiment of a display panel.

Referring to FIG. 5A, a display panel 1000 according to an embodiment includes a display area 1000D for displaying an image and a non-display area 1000P disposed around the display area 1000D, in which the binding element may be located.

The display area 1000D may include a plurality of pixels PXs arranged along a row (e.g., x direction), a column (e.g., y direction), or a combination thereof, and each pixel PX may include a plurality of sub-pixels $PX_1$, $PX_2$, and $PX_3$ displaying different colors. As an example, a configuration in which three sub-pixels $PX_1$, $PX_2$, and $PX_3$ constitute one pixel PX is illustrated, but the configuration is not limited thereto. An additional sub-pixel such as a white sub-pixel may be further included, and one or more sub-pixel displaying the same color may be included. The plurality of pixels PXs may be arranged in, for example, a Bayer matrix, a PenTile matrix, a diamond matrix, or a combination thereof, but is not limited thereto.

Each of the sub-pixels $PX_1$, $PX_2$, and $PX_3$ may be configured to display a color of three primary colors or a combination of three primary colors, for example, red, green, blue, or a combination thereof (e.g., white light). For example, the first sub-pixel $PX_1$ may be configured to display red, the second sub-pixel $PX_2$ may be configured to display green, and the third sub-pixel PX 3 may be configured to display blue.

In FIG. 5A, each of the sub-pixels are depicted to have the same size and the same shape, but the present disclosure is not limited thereto. For example, a sub-pixels, e.g., at least one of the sub-pixels, may be larger or smaller, or have a different shape, than another sub-pixel.

In an embodiment, the display panel of an embodiment may include a light emitting panel 100 which may include a lower substrate 110, a buffer layer 111, a thin film transistor TFT, and a light emitting element 180. The display panel may further include a circuit element for switching and/or driving each of the light emitting elements.

Figure 5B:
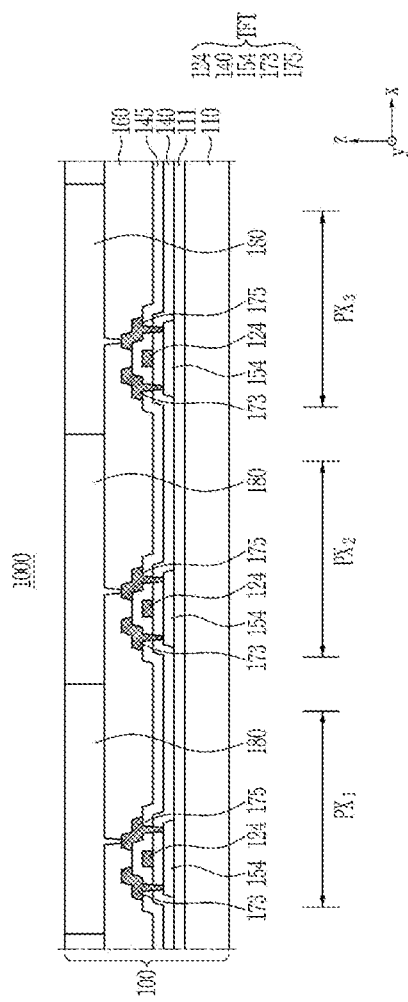
FIG. 5B is a cross-sectional view taken along line IV-IV as shown in FIG. 5A.

Referring to FIG. 5B, in the light emitting panel of an embodiment, the light emitting element 180 may be disposed for each sub-pixel $PX_1$, $PX_2$, and $PX_3$. The light emitting element 180 disposed in each sub-pixel $PX_1$, $PX_2$, and $PX_3$ may be independently driven. The subpixel may include a blue subpixel, red subpixel, or a green subpixel. A light emitting element 180, e.g., at least one of the light emitting elements 180, may be an electroluminescent element according to an embodiment described herein.

Details of the substrate 110 are the same as described herein. The buffer layer 111 may include an organic material, an inorganic material, or an organic-inorganic material. The buffer layer 111 may include, for example, an oxide, a nitride, or an oxynitride, and may include, for example, silicon oxide, silicon nitride, silicon oxynitride, or a combination thereof, but is not limited thereto. The buffer layer 111 may be one layer or two or more layers and may cover a portion of or the entire surface of the lower substrate 110. The buffer layer 111 may be omitted.

The thin film transistor TFT may be a three terminal element for switching the light emitting element 180, driving the light emitting element 180, or a combination thereof, and one or two or more may be included for each sub-pixel. The thin film transistor TFT may include a gate electrode 124, a semiconductor layer 154 overlapped with the gate electrode 124, a gate insulating layer 140 between the gate electrode 124 and the semiconductor layer 154, and a source electrode 173 and a drain electrode 175 electrically connected to the semiconductor layer 154. A coplanar top gate structure is shown as an example, but the structure is not limited thereto and may have various structures.

The gate electrode 124 is electrically connected to a gate line (not shown), and may include, for example, a low-resistance metal such as aluminum (Al), molybdenum (Mo), copper (Cu), titanium (Ti), silver (Ag), gold (Au), an alloy thereof, or a combination thereof, but is not limited thereto.

The semiconductor layer 154 may be an inorganic semiconductor such as amorphous silicon, polycrystalline silicon, or oxide semiconductor; an organic semiconductor; an organic-inorganic semiconductor; or a combination thereof. For example, the semiconductor layer 154 may include an oxide semiconductor including indium (In), zinc (Zn), tin (Sn), gallium (Ga), or a combination thereof, and the oxide semiconductor may include, for example, indium-gallium-zinc oxide, zinc-tin oxide, or a combination thereof, but the oxide semiconductor is not limited thereto. The semiconductor layer 154 may include a channel region and doped regions disposed on both sides of the channel region and electrically connected to the source electrode 173 and the drain electrode 175, respectively.

The gate insulating layer 140 may include an organic material, an inorganic material, or an organic-inorganic material, and may include, for example, an oxide, a nitride, or an oxynitride, and may include, for example, silicon oxide, silicon nitride, silicon oxynitride, or a combination thereof, but is not limited thereto. In FIG. 5B, an example in which the gate insulating layer 140 is formed on the entire surface of the lower substrate 110 is illustrated, but the present disclosure is not limited thereto and may be selectively formed between the gate electrode 124 and the semiconductor 154. The gate insulating layer 140 may be formed of one or two or more layers.

The source electrode 173 and the drain electrode 175 may include, for example, a low-resistance metal such as aluminum (Al), molybdenum (Mo), copper (Cu), titanium (Ti), silver (Ag), gold (Au), an alloy thereof, or a combination thereof, but are not limited thereto. The source electrode 173 and the drain electrode 175 may be electrically connected to the doped regions of the semiconductor layer 154, respectively. The source electrode 173 is electrically connected to a data line (not shown), and the drain electrode 175 is electrically connected to a light emitting element 180.

An interlayer insulating layer 145 is additionally formed between the gate electrode 124 and the source/drain electrodes 173 and 175. The interlayer insulating layer 145 may include an organic material, an inorganic material, or an organic-inorganic material, for example, oxide, nitride, or oxynitride, for example, silicon oxide, silicon nitride, silicon oxynitride, or a combination thereof, but is not limited thereto. The interlayer insulating layer 145 may be formed of one or two or more layers.

A protective layer 160 is formed on the thin film transistor TFT. The protective layer 160 may be, for example, a passivation layer. The protective layer 160 may include an organic material, an inorganic material, or an organic-inorganic material, for example, polyacrylic, polyimide, polyamide, poly(amide-imide), or a combination thereof, but is not limited thereto. The protective layer 160 may be formed of one or two or three or more layers.

In an embodiment, one of the first electrode 1, 10 and the second electrode 5, 50, may be a pixel electrode linked to the TFT and the other of them may be a common electrode.

In an embodiment, the electroluminescent device or the display device including the same may be used in a top emission type, a bottom emission type, a dual emission type, or a combination thereof.

In an embodiment, the first electrode 1, 11, 10 may be a light transmitting electrode and the second electrode 5, 15, 50 may be a reflective electrode, and the display panel may be a bottom emission type display panel that emits light toward the first electrode and the substrate, if present. In an embodiment, the first electrode 1, 10 may be a reflective electrode and the second electrode 5, 50 may be a light transmitting electrode, and the display panel may be a top emission type display panel that emits light to the opposite side of the first electrode 10 and the substrate 100 if present. In an embodiment, both the first electrode and the second electrode may be translucent electrodes, and the display panel 1000 may be a both side emission type display panel that emits light on the substrate side and on the opposite side of the substrate.

The display device or an electronic apparatus may include (or may be) a television, a virtual reality/augmented reality ("VR/AR"), a handheld terminal, a monitor, a notebook computer, an electronic display board, a camera, or a part for an automatic, e.g., autonomous, vehicle.

Specific examples are described below. However, the examples described below are only for specifically illustrating or explaining the disclosure, and the scope of the disclosure is not limited thereto.

EXAMPLES

1. Electroluminescence Measurement

A current according to an applied voltage is measured with a Keithley 2635B source meter, and a CS2000 spectrometer is used to measure electroluminescent properties (e.g., luminance) of a light-emitting device.

2. Life-span Characteristics

T90 and T50 are measured with an initial luminance of 650 nit (candelas per square meter (cd/m$^2$)).

For the measurement of T90, a device is operated with a current value corresponding to a predetermined luminance (e.g., 650 nit) measured through a spectral luminance meter. The light emitted from the device is converted into a photocurrent corresponding to the predetermined luminance through a photo-diode, and based on the initial photocurrent value 100%, the time (hours (hr)) taken to become 90% of the initially measured photocurrent value is measured.

For the measurement of T50, a device is operated with a current value corresponding to a predetermined luminance (e.g., 650 nit) measured through a spectral luminance meter. The light emitted from the device is converted into a photocurrent corresponding to the predetermined luminance through a photo-diode, and based on the initial photocurrent value 100%, the time (hr) taken to become 50% of the initially measured photocurrent value is measured.

3. PL Spectroscopy Analysis

A photoluminescence ("PL") spectrum of quantum dots and a layer containing the same is obtained through CS-2000 (spectral radiometer) with an excitation of 405 nanometer (nm) laser (Power Technology Inc.) light to the sample in the darkroom.

4. TEM Analysis

Transmission electron micrographs of the prepared quantum dots and nanoparticles are obtained by using UTF30 Tecnai electron microscope. The average particle size and particle size distribution are obtained using Image J program from the obtained transmission electron micrograph.

The following synthesis is performed under an inert gas atmosphere (e.g., under nitrogen) unless otherwise specified. A precursor content is provided as a molar content, unless otherwise specified.

Synthesis Example 1

An amount of 2 moles per liter (M) of a Se/trioctylphosphine ("TOP") stock solution, 1 M of a S/TOP stock solution, and 0.1 M of a Te/TOP stock solution are prepared by dispersing selenium (Se), sulfur (S), and tellurium (Te) in trioctylphosphine ("TOP"), respectively. In a reactor containing trioctylamine, 0.125 millimoles (mmol) of zinc acetate is added to the reactor with oleic acid and heated at 120° C. under vacuum. After 1 hour, nitrogen is introduced into the reactor.

The reactor is heated to 300° C., and the Se/TOP stock solution and the Te/TOP stock solution in a Te:Se mole ratio of 1:20 are rapidly added to, e.g., injected into, the reactor. After 40 minutes, the reaction is complete, and the reaction solution is rapidly cooled to room temperature and acetone is added to the reactor. The resulting product mixture is centrifuged and the precipitate is separated and dispersed in toluene to prepare a ZnSeTe core particle dispersion.

Amounts of 1.8 mmol of zinc acetate and oleic acid are added to a flask containing trioctylamine and the prepared mixture is heated at 120° C. under vacuum for 10 minutes. Nitrogen ($N_2$) is then introduced into the reactor, the reactor is heated to 180° C., and the prepared ZnTeSe core particle dispersion is added quickly to the reactor. The Se/TOP stock solution and the S/TOP stock solution are also added to the reactor, and the reactor temperature is raised to about 280° C. After 2 hours, the reaction is complete, and the reactor is cooled to room temperature and ethanol is added to facilitate precipitation of the semiconductor nanoparticles, which are separated by centrifuge. The prepared semiconductor nanoparticles emit blue light, and a photoluminescent spectroscopy analysis using Hitachi F-7000 spectrophotometer confirms that the blue light has a peak emission wavelength of about 455 nanometers (nm).

The synthesized semiconductor nanoparticles (optical density 0.25 at 420 nm, 6 milliliters (mL)) are precipitated with ethanol and centrifuged and the separated nanoparticles dispersed in octane to prepare an octane dispersion.

Synthesis Example 2: Synthesis of ZnMgO Nanoparticles

Zinc acetate dihydrate and magnesium acetate tetrahydrate are added into a reactor including dimethylsulfoxide at a pre-determined mole ratio according to the following chemical formula and heated at 60° C. in an air atmosphere. Subsequently, a solution of tetramethylammonium hydroxide pentahydrate and ethanol is added into the reactor in a dropwise fashion at a speed of 3 milliliters per minute (mL/min). After stirring the mixture, the prepared $Zn_{1-x}Mg_xO$ nanoparticles are centrifuged, separated, and dispersed in ethanol to provide an ethanol dispersion of $Zn_{1-x}Mg_xO$ (x=0.15) nanoparticles.

The prepared nanoparticles are analyzed by a transmission electron microscopic analysis, and the results show that the particles have an average particle size of about 3 nm.

Synthesis Example 3: Synthesis of ZnS Nanoparticles as an Inorganic Nanoparticle Sulfur is dispersed in trioctylphosphine ("TOP") to obtain 1M of S/TOP stock solution. In a 300 mL reaction flask, zinc acetate with oleic acid is dissolved in trioctylamine and heated to 120° C. under vacuum. Inert gas is then introduced into the reactor, the reactor is heated to 300° C., and the prepared S/TOP stock solution is added quickly to the reactor. After 1 hour, the reaction is complete, and the reactor is cooled to room temperature and ethanol is added to facilitate precipitation of the ZnS nanoparticles, which are separated by centrifuge and dispersed in hexane to obtain a dispersion including the ZnS nanoparticles.

The ratio of the Zn and S precursors as used (Zn:S) is 2:1.

Figure 12A:
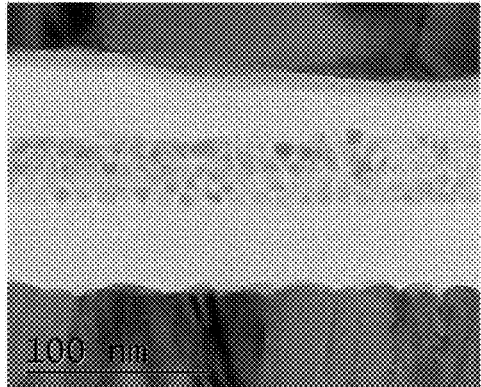
FIG. 12A is a TEM image of a cross section of the light emitting layer in the electroluminescent device of Example 1.
Figure 12B:
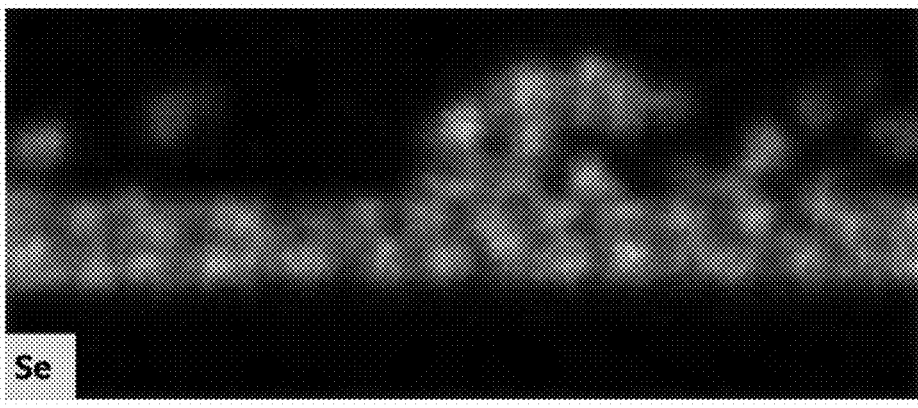
FIG. 12B is a TEM-energy-dispersive X-ray ("EDX") image of a cross section of a light emitting layer in the electroluminescent device of Example 1.
Figure 12C:
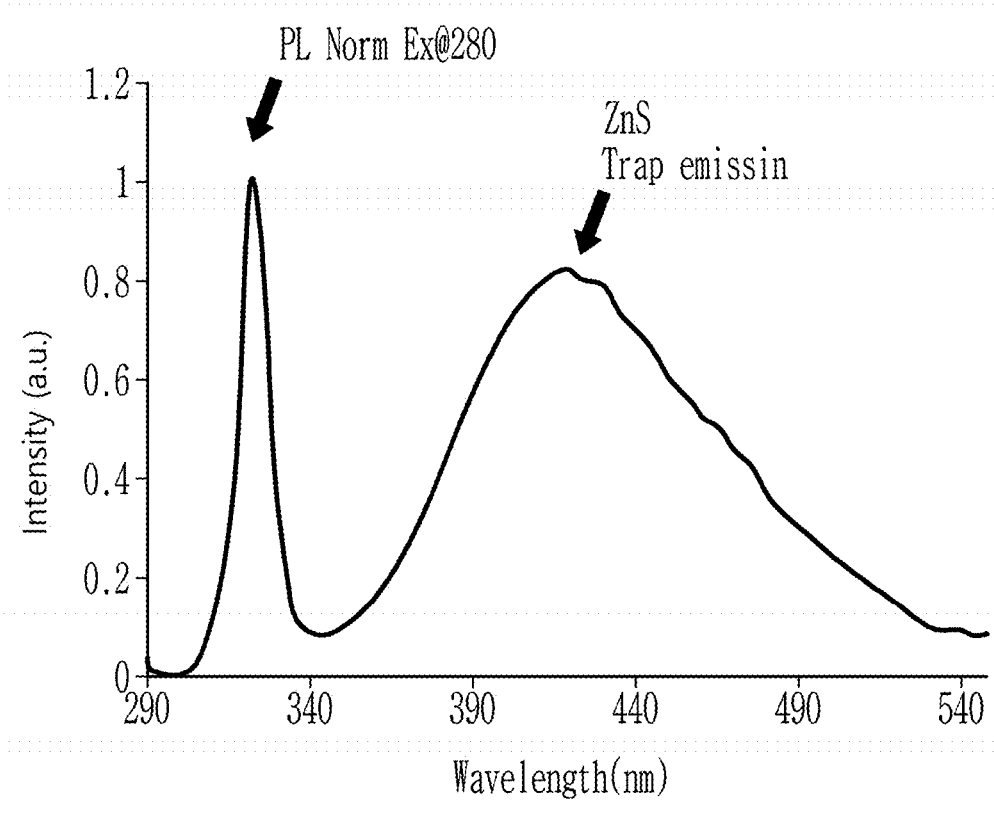
FIG. 12C is a photoluminescent spectrum of the inorganic nanoparticles (ZnS nanoparticles) prepared in Synthesis Example 3.

A photoluminescent spectroscopy analysis (using incident light of a wavelength of 280 nm) is carried out for the prepared inorganic nanoparticles and the results are shown in FIG. 12C.

Example 1

The dispersion of zinc magnesium oxide nanoparticles prepared in Synthesis Example 2 is used as an electron transport layer dispersion (hereinafter, ETL dispersion). The ZnS nanoparticles prepared in Synthesis Example 3 and the quantum dots synthesized in Synthesis Example 1 are dispersed in octane at a volume ratio of 1:1 to prepare a first dispersion. The quantum dots synthesized in Synthesis Example 1 are dispersed in octane to prepare a second dispersion.

A glass substrate deposited with indium tin oxide ("ITO") is surface treated with ultraviolet ("UV")-ozone for 15 minutes, and then spin-coated with a poly(3,4-ethylenedioxythiophene):polystyrene sulfonate ("PEDOT:PSS") solution (H.C. Starks) and heated at 150° C. for 10 minutes under air atmosphere and heated again at 150° C. for 20 to 30 minutes under $N_2$ atmosphere to provide a hole injection layer ("HIL") having a thickness of 30 nm.

Subsequently, poly[(9,9-dioctylfluoren-2,7-diyl-co(4,4'-(N-4-butylphenyl)diphenylamine] solution ("TFB") (Sumitomo) is spin-coated on the hole injection layer and heated at 180° C. for 30 minutes to provide a hole transport layer ("HTL") having a thickness of 25 nm.

The second dispersion is spin-coated on the prepared hole transport layer to prepare a quantum dot layer having a thickness of 20 nm, which is then heat-treated at a temperature of about 80° C. under a nitrogen atmosphere for 30 minutes. After the heat-treatment, the first dispersion is spin-coated on the quantum dot layer to form the first layer having a thickness of 20 nm. The formed first layer is heat-treated at a temperature of about 80° C. under a nitrogen atmosphere for 30 minutes.

The ETL dispersion is spin-coated onto the heat-treated first layer and is heat-treated at 80° C. to form an electron transport layer with a thickness of about 20 nm.

Aluminum (Al) is vacuum-deposited, e.g., deposited under vacuum, on the prepared electron transport layer to prepare a second electrode of a thickness of about 100 nm, to obtain an electroluminescent device.

Figure 6:
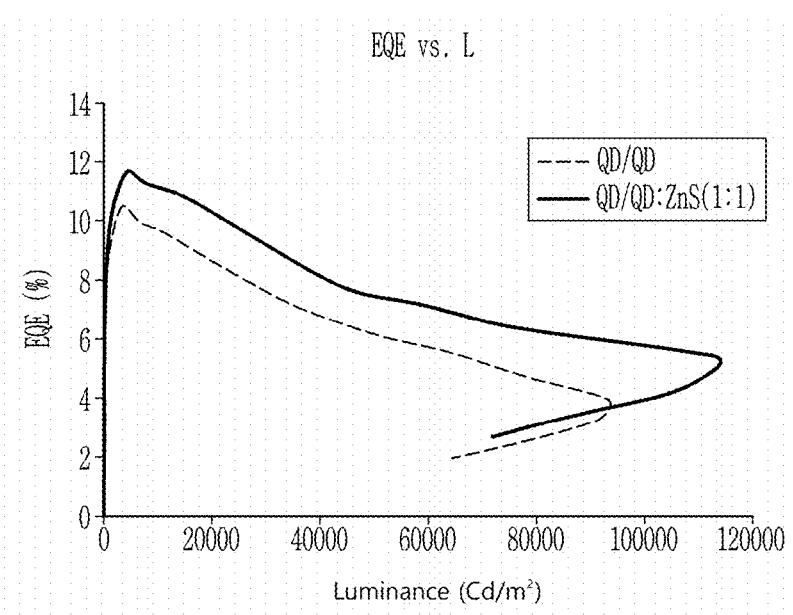
FIG. 6 is a graph of external quantum efficiency ("EQE") (percent (%)) versus luminance (L) (candelas per square meter (cd/m$^2$)) of the electroluminescent devices of Example 1 (QD/QD:ZnS(1:1)) and Comparative Example 1 (QD/QD)
Figure 7A:
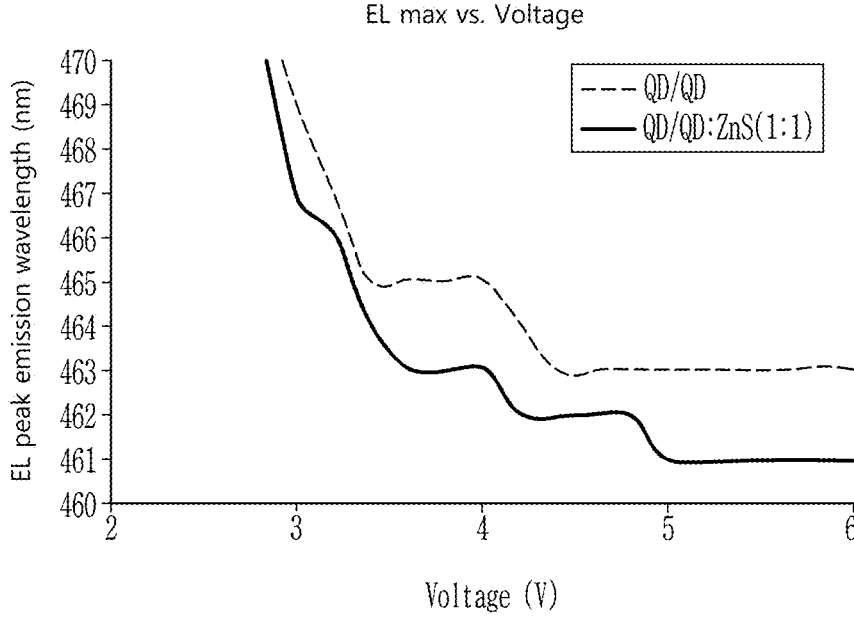
FIG. 7A is a graph of electroluminescent ("EL") peak emission ("ELMAX") wavelength (nanometers (nm)) versus voltage (volts (V)) of the electroluminescent devices of Example 1 and Comparative Example 1.
Figure 7B:
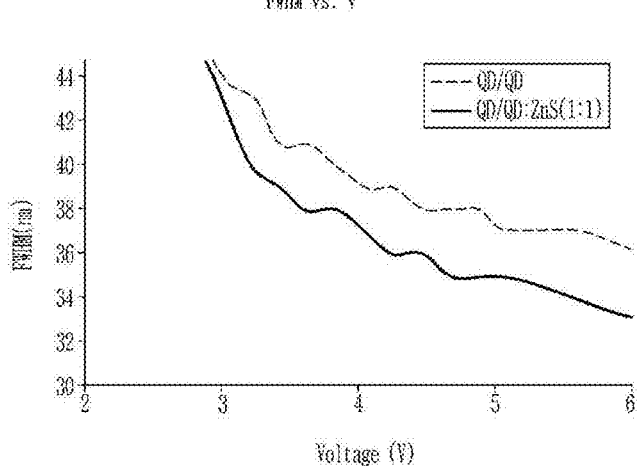
FIG. 7B is a graph of full width at half maximum ("FWHM") (nm) versus voltage (V) of the electroluminescent devices of Example 1 and Comparative Example 1.

Electroluminescent properties of the prepared electroluminescent device are measured and the results are shown in Table 1, FIG. 6, FIG. 7A, and FIG. 7B. A T90 of the prepared electroluminescent device is at least 36 hours.

Figure 10A:
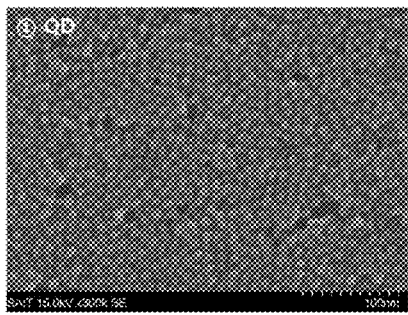
FIGS. 10A, 10B, and 10C are scanning electron microscope (SEM) analysis results of quantum dots, inorganic nanoparticles, and a mixture thereof that are used to prepare a light emitting layer (a QD layer and a first layer) in the electroluminescent device of Example 1, respectively.
Figure 10B:
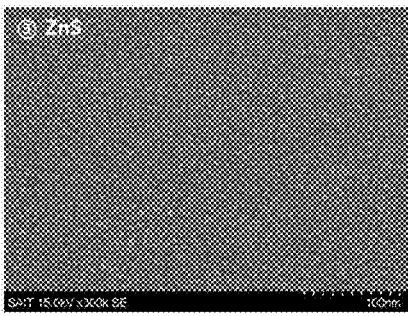
Figure 10C:
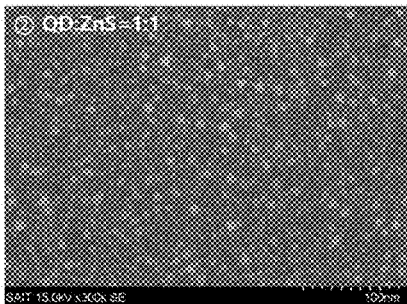

The second dispersion, the dispersion including the ZnS nanoparticles, and the first dispersion are applied to a glass substrate and a scanning electron microscopy analysis is conducted by using a scanning electron microscope (product name:S-4700, manufacturer: Hitachi), and the results (top view) are shown in FIG. 10A, FIG. 10B, and FIG. 10C.

Figure 11:
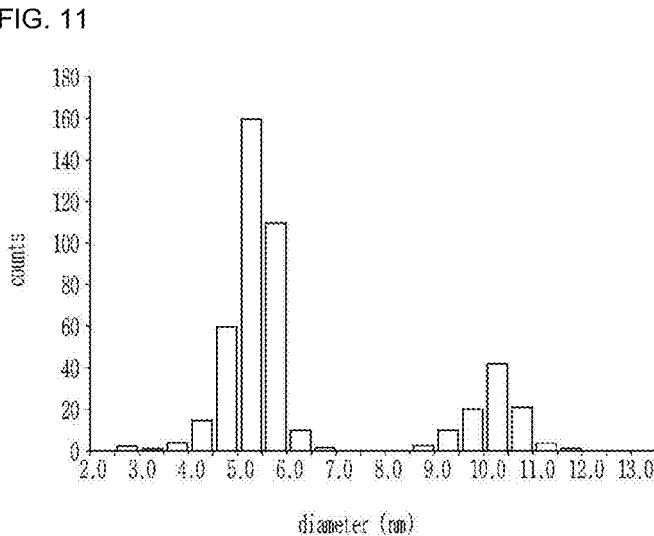
FIG. 11 is a size distribution (histogram) of counts versus diameter (nm) obtained by a transmission electron microscopy ("TEM") for a mixture of the quantum dots and the inorganic nanoparticles used to prepare a light emitting layer (a QD layer and a first layer) in the electroluminescent device of Example 1.

A particle size distribution is obtained by performing a transmission electron microscopy ("TEM") analysis on the first dispersion, and this is shown in FIG. 11. As shown in FIG. 11, the bimodal distribution is obtained.

A TEM analysis and a TEM-energy-dispersive X-ray ("EDX") analysis on the cross-section of the manufactured electroluminescent device are conducted, and the results are shown in FIG. 12A and FIG. 12B. Referring to FIG. 12A and FIG. 12B, it is confirmed that the electroluminescent device includes a first layer between the quantum dot layer and the electron transport layer.

Example 2

An electroluminescent device is prepared in the same manner as Example 1 except that in the first dispersion, a volume ratio of the quantum dots and the ZnS nanoparticles is 1:2. Electroluminescent properties of the prepared electroluminescent device are measured and the results are shown in Table 1. A T90 of the prepared electroluminescent device is at least 36 hours.

Example 3

An electroluminescent device, for example, including a configuration of the light emitting layer shown in FIG. 4H is prepared in the same manner as Example 1 except for the following.

The first dispersion is spin-coated on the prepared hole transport layer to prepare a first layer having a thickness of 20 nm, which is then heat-treated at a temperature of about 80° C. under a nitrogen atmosphere for 30 minutes. After the heat-treatment, the second dispersion is spin-coated on the first layer to form the quantum dot layer having a thickness of 20 nm. The quantum dot layer is heat-treated at a temperature of about 80° C. under a nitrogen atmosphere for 30 minutes.

The prepared electroluminescent device has a maximum external quantum efficiency of 11% and is configured to emit light having a full width at half maximum of about 44 nm.

Example 4

An electroluminescent device, for example, including a configuration of the light emitting layer shown in FIG. 4G is prepared in the same manner as Example 1 except for the following.

The first dispersion is spin-coated on the prepared hole transport layer to prepare a layer having a thickness of 20 nm, which is then heat-treated at a temperature of about 80° C. under a nitrogen atmosphere for 30 minutes. After the heat-treatment, the first dispersion is spin-coated on the layer to form an additional layer having a thickness of 20 nm. The additional layer is heat-treated at a temperature of about 80° C. under a nitrogen atmosphere for 30 minutes.

The prepared electroluminescent device has a maximum external quantum efficiency of 11% and is configured to emit light having a full width at half maximum of about 40 nm.

Comparative Example 1

An electroluminescent device is prepared in the same manner as Example 1 except that the formation of the quantum dot layer is repeated twice without the formation of the first layer to form the light emitting layer with a thickness of 20 nm+20 nm (a total thickness of 40 nm).

Electroluminescent properties of the prepared electroluminescent device are measured and the results are shown in Table 1, FIG. 6, FIG. 7A and FIG. 7B. A T90 of the prepared electroluminescent device is about 80% or less (e.g., 70%) of the T90 of the electroluminescent device of Example 1. In other words, The T90 of the prepared electroluminescent device is less than the T90 of the electroluminescent device of Example 1 by at least 20% or at least 30%.

TABLE 1

|  | External Quantum Efficiency ("EQE") (maximum), % | Maximum Luminance (nit) | T50 (hours) |
|---|---|---|---|
| Example 1 | 12 | 113,448 | 310 |
| Example 2 | 13 | 114,148 | 284 |
| Comp. Example 1 | 10 | 94,338 | 221 | nit: cd/m²

The results of Table 1, FIG. 6A, and FIG. 6B confirmed that the electroluminescent device of Example may exhibit significantly increased lifespan characteristics as well as relatively improved EL properties compared to the device of Comparative Example.

The results of FIG. 7A and FIG. 7B confirmed that in case of the devices of the examples, as the applied voltage increases, the blue shift in the peak emission wavelength increases and the full width at half maximum ("FWHM") can be decreased more sharply.

In the examples, the maximum width of the blue shift is greater than 7 nm (e.g., greater than or equal to 8 nm or 9 nm). In the examples, the maximum reduction of the FWHM is greater than 8 nm, for example, greater than or equal to 9 nm or 11 nm.

These results may suggest that color purity will be positively affected when the electroluminescent device of an embodiment is applied.

Experimental Example 1: PL Characteristics of the First Layer

The ZnS nanoparticles prepared in Synthesis Example 3 and the quantum dots synthesized in Synthesis Example 1 are dispersed in octane in a volume ratio of 5:1, 1:1, and 1:3, respectively, to prepare Dispersions 1, 2, and 3. The quantum dots synthesized in Synthesis Example 1 are dispersed in octane to prepare a dispersion 4 ("QD").

The prepared Dispersion 1, 2, 3, and 4 are used to prepare emission layer ("EML") thin films 1, 2, 3, and 4. Specifically, the dispersion is spin-coated on a glass substrate to form a layer of a thickness of 20 nm.

An incident light (wavelength: 450 nm) is irradiated to the EML thin films 1, 2, 3, 4 to obtain photoluminescent spectrums, respectively, from which the peak emission wavelength and the full width at half maximum are measured. The results are summarized in Table 2.

TABLE 2

|  | Peak emission wavelength (nm) | Full width at half maximum (nm) | a variance of the luminance intensity |
|---|---|---|---|
| EML thin film 4 (QD only) | 462 | 39 | 11% |
| EML thin film 1 (QD:ZnS = 5:1) | 461 | 38 | 6% |
| EML thin film 2 (QD:ZnS = 1:1) | 460 | 37 | 4% |
| EML thin film 3 (QD:ZnS = 1:3) | 459 | 36 | 2% |

From the results of Table 2, it is confirmed that the photoluminescence wavelengths of EML thin films 1-3 are blue shifted compared to that of EML thin film 4 and the full width at half maximum of EML thin films 1-3 are also reduced compared to that of EML thin film 4.

Figure 8:
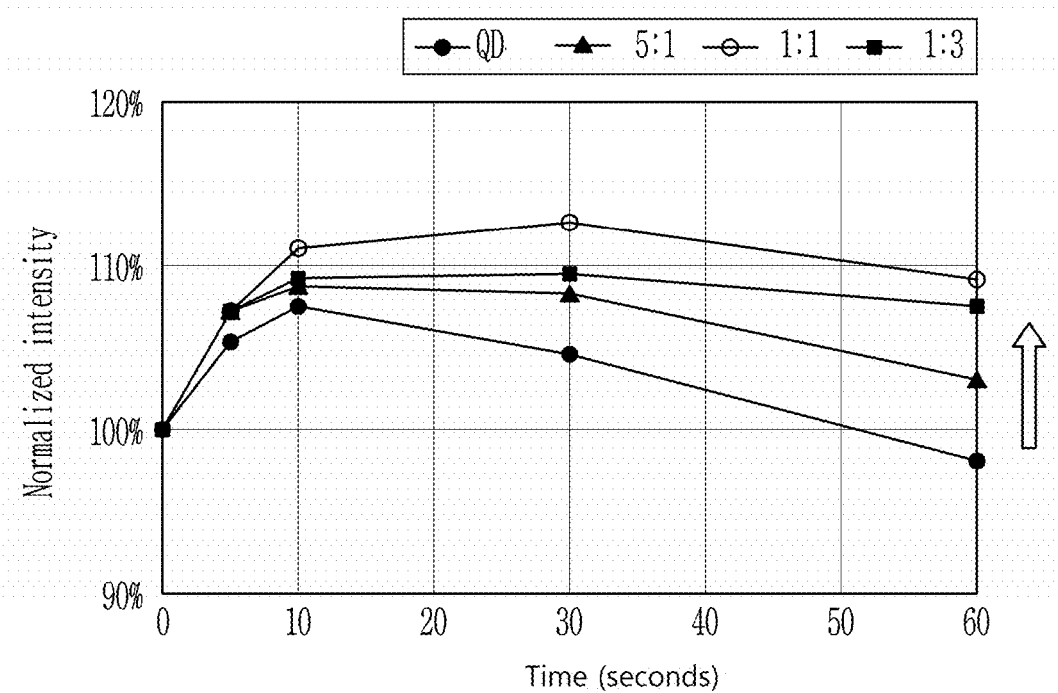
FIG. 8 is a diagram of normalized intensity (%) versus time (seconds (s)) that shows a result of Experimental Example 1 (a photoluminescent characteristic analysis)

Then, High-power laser (wavelength: 405 nm) is irradiated to the manufactured EML thin films 1, 2, 3, and 4 to observe changes in a PL intensity maintenance, and the results are summarized in FIG. 8.

From the results of FIG. 8, it can be understood that EML thin films 1-3 have a luminance intensity maintenance percentage (or relative luminance intensity) exceeding, e.g., of greater than 100% after one minute of irradiation of a high-power laser light source, while EML thin film 4 has a luminance intensity maintenance percentage of below, e.g., of less than, 100%. In the case of EML thin films 1-3, the maximum, e.g., normalized, relative luminance intensity value is approximately greater than 107%, while the difference between the relative photoluminescence intensity at 1 minute and the maximum relative, e.g., normalized, intensity value (i.e., a variance of the luminance intensity or a change with respect to the maximum relative intensity value) is less than 10%, less than 9%, less than 5%, or less than 4%, respectively. The variance of the luminance intensity for each of EML thin films 1-4 are summarized in Table 2. Such results indicate that the inclusion of the inorganic nanoparticles (e.g., ZnS nanoparticles) in the layer or an increase of their amount may improve the PL properties of the layer.

Experimental Example 2: Characteristics of an EOD Element for the First Layer An electron only device ("EOD") is manufactured in the following way:

The quantum dots synthesized in Synthesis Example 1 are dispersed in octane to prepare Dispersion 1. The quantum dots synthesized in Synthesis Example 1 and ZnS nanoparticles prepared in Synthesis Example 3 are dispersed in octane at a volume ratio of 1:1 to prepare Dispersion 2. The ZnS nanoparticles prepared in Synthesis Example 3 are dispersed in octane to prepare Dispersion 3.

A dispersion of zinc magnesium oxide nanoparticles is spin-coated on a glass substrate on which an ITO electrode (anode) is deposited and then heat treated at 80 degrees for 30 minutes to form an electron auxiliary layer (thickness: 30 nm).

A dispersion 1, a dispersion 2, and a dispersion 3 are spin-coated on the formed electron auxiliary layer to form layers 1, 2, and 3 each having a thickness of 20 nm, respectively. A dispersion of zinc magnesium oxide nanoparticles is spin-coated on the formed layers 1, 2, and 3 and heat treated at 80° C. for 30 minutes to form an electron auxiliary layer (thickness: 30 nm), and then an Al electrode is formed as a deposition to obtain EOD 1, EOD 2, and EOD 3.

Figure 9A:
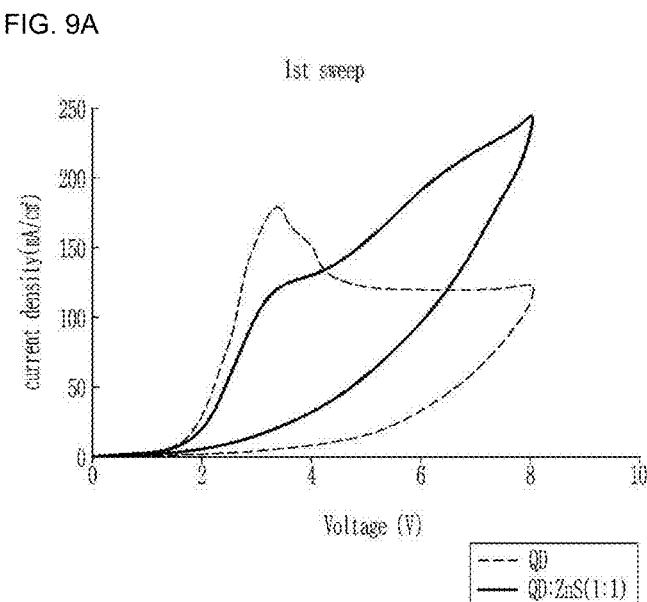
FIG. 9A is a graph of current density (milliamperes per square centimeters (mA/cm$^2$)) versus voltage (V) for a first sweep, showing a result of Experimental Example 2.
Figure 9B:
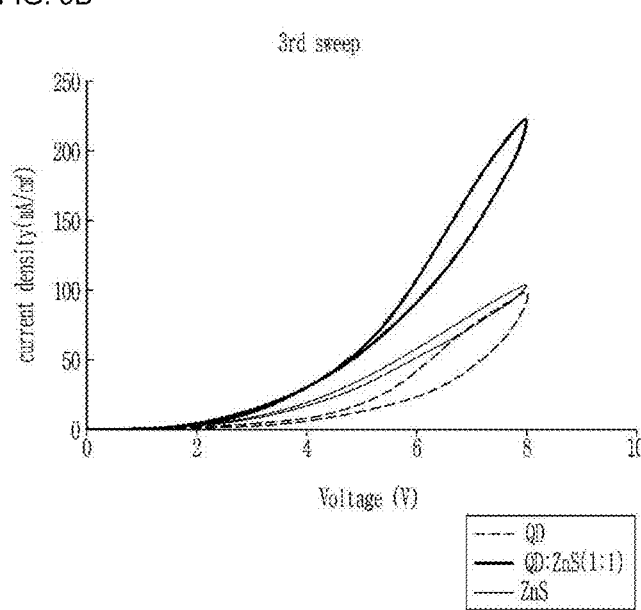
FIG. 9B is a graph of current density (milliamperes per square centimeters (mA/cm$^2$) versus voltage (V) for a third sweep, showing a result Experimental Example 2.

The sweep process of measuring the current density while increasing or decreasing the voltage between the ITO electrode and the Al electrode in the range of 0 volts (V) to 8 V is repeated three times, and the results are summarized in the table below. The results are summarized in FIG. 9A and FIG. 9B, and Table 3.

TABLE 3

| | Current density at 3 volts (milliamperes per square centimeter (mA/cm$^2$)), 1$^{st}$ sweep | Current density at 8 volts (mA/cm$^2$), 3$^{rd}$ sweep |
|---|---|---|
| EOD 1 | 158.5 | 105.2 |
| EOD 2 | 97.6 | 219.5 |
| EOD 3 | 20.2 | 100.7 |

From the above results, it is confirmed that EOD2 device including the layer 2 has increased resistance between 1st current-voltage ("JV") sweeps, but decreased hysteresis and increased current density between 3rd JV sweeps.

Experimental Example 3: Characteristics of the HOD Element of the First Layer A hole only device ("HOD") is manufactured in the following way:

The quantum dots synthesized in Synthesis Example 1 are dispersed in octane to prepare Dispersion 1. The quantum dots synthesized in Synthesis Example 1 and ZnS nanoparticles prepared in Synthesis Example 3 are dispersed in octane at a volume ratios of 1:1 and 1:2, respectively, to prepare Dispersion 2 and Dispersion 3.

On a glass substrate on which an ITO electrode (anode) is deposited, PEDOT:PSS as a hole injection layer, and TFB as a hole transport layer are provided, respectively, in the same manner as in Example 1, to form a hole auxiliary layer.

Dispersion 1, Dispersion 2, and Dispersion 3 are spin-coated on the formed hole auxiliary layer to form layers 1, 2, and 3 with a thickness of 20 nm, respectively. An additional organic hole auxiliary layer including a layer of tris(4-carbazoyl-9-ylphenyl)amine (TCTA) with a thickness of 36 nm and a layer of 1,4,5,8,9,11-hexa-azatriphenylene hexacarbonitrile (HATCN) with a thickness of 10 nm is formed on the formed layer 1, layer 2, and layer 3, and then an Al electrode is formed as a deposition to obtain HOD 1, HOD 2, and HOD 3.

The current density is measured by applying a voltage of 8 V between the ITO electrode and the Al electrode, and the results are summarized in Table 4.

TABLE 4

| | Hole Transport (HT) (mA/cm$^2$) | HT (Relative Current density percentage) |
|---|---|---|
| HOD 1 | 128.4 | 100% |
| HOD 2 | 23.9 | 19% |
| HOD 3 | 19.6 | 15% |

From the above results, it is confirmed that HOD 2 and 3 including layer 2 and layer 3 exhibit significantly lower hole transport than HOD 1. Therefore, it is confirmed that layer 2 and layer 3 can significantly suppress hole leakage to the electron transport layer.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. An electroluminescent device comprising
a first electrode;
a second electrode;
a quantum dot layer disposed between the first electrode and the second electrode; and
an electron transport layer disposed between the quantum dot layer and the second electrode;
wherein the quantum dot layer is configured to emit a first light, the quantum dot layer comprising a plurality of first quantum dots,
wherein the first quantum dots comprise a first semiconductor nanocrystal,
wherein the electron transport layer comprises zinc oxide nanoparticles,
wherein the electroluminescent device further comprises a first layer between the quantum dot layer and the electron transport layer, the first layer comprising a plurality of inorganic nanoparticles,
wherein the inorganic nanoparticle has a different composition from the zinc oxide nanoparticle and the first quantum dot, and
wherein the plurality of inorganic nanoparticles comprises a metal chalcogenide, and the metal chalcogenide has a bandgap energy that is greater than an optical energy of the first light.

2. The electroluminescent device of claim 1, wherein the first quantum dot comprises a Group II-VI compound, a Group III-V compound, a Group IV-VI compound, a Group IV element or a compound thereof, a Group compound, a Group I-II-IV-VI compound, or a combination thereof, wherein the first light has a red light spectrum, a green light spectrum, or a blue light spectrum, and optionally wherein a full width at half maximum of the first light is greater than or equal to about 1 nanometer and less than or equal to about 55 nanometers.

3. The electroluminescent device of claim 1, wherein the first quantum dot comprises a core comprising the first semiconductor nanocrystal and a shell disposed on the core, and the first semiconductor nanocrystal comprises a zinc chalcogenide, an indium phosphide, or a combination thereof.

4. The electroluminescent device of claim 1, wherein the quantum dot layer does not comprise the inorganic nanoparticle.

5. The electroluminescent device of claim 1, wherein the zinc oxide nanoparticle further comprises an alkali metal, an alkali earth metal, Zr, W, Li, Ti, Y, Al, gallium, indium, tin, cobalt, vanadium, or a combination thereof.

6. The electroluminescent device of claim 1, wherein the metal chalcogenide comprises zinc, magnesium, calcium, barium, or a combination thereof; or wherein the bandgap energy of the metal chalcogenide is greater than or equal to about 2.9 electron volts and less than or equal to about 10 electron volts.

7. The electroluminescent device of claim 1, wherein the metal chalcogenide comprises a magnesium sulfide, a magnesium selenide, a magnesium sulfide selenide, a zinc magnesium selenide, a zinc magnesium sulfide, a zinc sulfide, a zinc selenide sulfide, or a combination thereof.

8. The electroluminescent device of claim 1, wherein the inorganic nanoparticle has a size of greater than or equal to about 2 nanometers and less than or equal to about 30 nanometers, and optionally wherein the bandgap energy of the metal chalcogenide is greater than or equal to about 3.2 electron volts and less than or equal to about 6.8 electron volts.

9. The electroluminescent device of claim 1, wherein the first layer further comprises a plurality of second quantum dots, and optionally wherein the second quantum dot comprises the first semiconductor nanocrystal.

10. The electroluminescent device of claim 9, wherein the second quantum dot comprises a core comprising the first semiconductor nanocrystal and a shell disposed on the core, and the first semiconductor nanocrystal comprises a zinc chalcogenide, an indium phosphide, or a combination thereof.

11. The electroluminescent device of claim 9, wherein as the first layer is exposed to a high-power laser emitting light of a predetermined wavelength for 60 seconds, the first layer has a luminance intensity maintenance percentage of greater than or equal to about 100% and less than or equal to about 120% based on an initial luminance intensity of 100%.

12. The electroluminescent device of claim 1, wherein a thickness of the first layer is greater than or equal to about 4 nanometers and less than or equal to about 50 nanometers, and optionally wherein the quantum dot layer has a thickness of greater than or equal to about 5 nanometers and less than or equal to about 50 nanometers.

13. The electroluminescent device of claim 1, wherein the electroluminescent device is configured to emit blue light; and wherein the electroluminescent device exhibits a maximum luminance of greater than or equal to about 100,000 candelas per square meter, or wherein the electroluminescent device exhibits a maximum external quantum efficiency of greater than or equal to about 11%, or wherein the electroluminescent device exhibits a T90 of greater than or equal to about 26 hours as measured at an initial luminance of 650 candelas per square meter.

14. A display device comprising the electroluminescent device of claim 1.

15. The display device of claim 14, wherein the display device comprises a handheld terminal, a monitor, a notebook computer, a television, an electronic display board, a camera, or an electronic component for an autonomous vehicle.

16. An electroluminescent device comprising
a first electrode;
a second electrode;
a light emitting layer disposed between the first electrode and the second electrode, the light emitting layer comprising a semiconductor nanoparticle population; and
optionally, an electron auxiliary layer between the light emitting layer and the second electrode,
wherein the light emitting layer is configured to emit a first light,
wherein the semiconductor nanoparticle population comprises a plurality of quantum dots and a plurality of inorganic nanoparticles,
wherein the first light has a full width at half maximum of greater than or equal to about 1 nanometer and less than or equal to about 55 nanometers,
wherein the semiconductor nanoparticle population exhibits a multi-modal distribution comprising a first peak particle size and a second peak particle size in a size analysis,
wherein the second peak particle size is greater than the first peak particle size,
and wherein the first peak particle size is greater than or equal to about 2 nanometers and less than or equal to about 15 nanometers.

17. The electroluminescent device of claim 16, wherein the quantum dots comprise a first semiconductor nanocrystal, and the inorganic nanoparticle comprises a metal chalcogenide, and a bandgap energy of the inorganic nanoparticle is greater than a bandgap energy of the first semiconductor nanocrystal by greater than or equal to about 0.1 electron volts.

18. The electroluminescent device of claim 16, wherein the quantum dot comprises a zinc chalcogenide comprising zinc and selenium, the inorganic nanoparticle comprises a metal sulfide, and the metal sulfide comprises zinc, magnesium, or a combination thereof.

19. The electroluminescent device of claim 16, wherein the first peak particle size is greater than or equal to about 3 nanometers and less than or equal to about 10 nanometers.

20. The electroluminescent device of claim 16, wherein the second peak particle size is greater than or equal to about 5 nanometers and less than or equal to about 50 nanometers, and optionally wherein a difference between the first peak particle size and the second peak particle size is greater than or equal to about 4 nanometers and less than or equal to about 20 nanometers.

21. The electroluminescent device of claim 16, wherein in the multimodal distribution, a ratio of a mode of the second peak particle size to a mode of the first peak particle size is greater than or equal to about 0.1:1 and less than or equal to about 1:1.

* * * * *